US005990727A

United States Patent [19]

Kimura

[11] Patent Number: 5,990,727

[45] Date of Patent: Nov. 23, 1999

[54] CURRENT REFERENCE CIRCUIT HAVING BOTH A PTAT SUBCIRCUIT AND AN INVERSE PTAT SUBCIRCUIT

[75] Inventor: Katsuji Kimura, Tokyo, Japan

[73] Assignee: NEC Corporation, Tokyo, Japan

[21] Appl. No.: 08/864,900

[22] Filed: May 29, 1997

Related U.S. Application Data

[62] Division of application No. 08/588,316, Jan. 18, 1996.

[30] Foreign Application Priority Data

May 26, 1995 [JP] Japan .................................... 7-152295

[51] Int. Cl.$^{6}$ ..................................................... H01L 35/00

[52] U.S. Cl. ........................ 327/513; 327/538; 327/530; 323/312; 323/315

[58] Field of Search .................................... 327/538, 539, 327/543, 513; 323/313, 314, 315, 312

[56] References Cited

U.S. PATENT DOCUMENTS

| | | | |
|---|---|---|---|
| 4,507,573 | 3/1985 | Nagano | 327/513 |
| 5,034,626 | 7/1991 | Pirez et al. | 327/513 |
| 5,038,053 | 8/1991 | Djenguerian et al. | 327/513 |
| 5,357,149 | 10/1994 | Kimura | 307/310 |
| 5,438,296 | 8/1995 | Kimura | 327/560 |
| 5,481,224 | 1/1996 | Kimura | 330/253 |
| 5,500,623 | 3/1996 | Kimura | 330/252 |
| 5,512,855 | 4/1996 | Kimura | 327/538 |
| 5,581,211 | 12/1996 | Kimura | 327/356 |
| 5,604,427 | 2/1997 | Kimura | 323/312 |
| 5,744,999 | 4/1998 | Kim et al. | 327/513 |

OTHER PUBLICATIONS

K. Kimura, "Low Temperature Coefficient CMOS Voltage Reference Circuits," *IEICE Trans. Fundamentals*, vol. E77–A, No. 2, Feb. 1994.

*Primary Examiner*—Timothy P. Callahan
*Assistant Examiner*—Jung Ho Kim
*Attorney, Agent, or Firm*—Sughrue, Mion, Zinn, Macpeak & Seas, PLLC

[57] ABSTRACT

A current reference circuit is capable of operation at a very low supply voltage, such as 1 volt. The current reference circuit is composed of a current mirror circuit, serving as an inverse PTAT (i.e., inversely proportional to absolute temperature) subcircuit, and a PTAT subcircuit for driving the current mirror circuit. The current mirror circuit and the PTAT subcircuit are mutually biased to each other. First and second constant currents produced by the PTAT subcircuit are supplied to the current mirror circuit as its reference and mirror currents, thereby cancelling the temperature coefficients of the first and second constant currents.

7 Claims, 18 Drawing Sheets

CURRENT REFERENCE CIRCUIT HAVING BOTH A PTAT SUBCIRCUIT AND AN INVERSE PTAT SUBCIRCUIT

This is a divisional of application Ser. No. 08/588,316 filed Jan. 18, 1996.

BACKGROUND OF THE INVENTION

1. Field of the Invention

The present invention relates to a current mirror circuit and a current reference circuit and more particularly, to a current mirror circuit and a current reference circuit that can be operated at an extremely low supply voltage of approximately 1 V.

2. Description of the Prior Art

A current reference circuit producing a constant reference current whose current value decreases in inverse proportion to the ambient absolute temperature is termed an "inversely proportional to absolute temperature (inverse PTAT)" circuit. The constant reference current thus produced has a negative temperature coefficient.

When the supply voltage is comparatively high (for example, 3 V or more), there have been known some inversely PTAT circuits, an example of which is shown in FIG. 1. In the circuit of FIG. 1, a difference current between a bias current for one diode-connected bipolar transistor and another bias current for two diode-connected bipolar transistors is taken out as an output current having a negative temperature coefficient.

Specifically, two npn bipolar transistors Q51 and Q52 and a resistor R51 (resistance: $r_{51}$) constitute a first current mirror circuit. The transistor Q51 has a base and a collector coupled together, in other words, it is diode-connected. A current flowing through the resistor R51, i.e., a collector current of the transistor Q51, serves as a reference current. A collector current $I_1$ of the transistor Q52 serves as a mirror current for the reference current.

The mirror current $I_1$ is expressed as $$(V_{STB}-V_{BE51})/r_{51},$$

where $V_{STB}$ is a supply voltage and $V_{BE51}$ is the base-to-emitter voltage (typically, 0.6 to 0.7 V) of the transistor Q51.

Three npn bipolar transistors Q53, Q54 and Q57 and a resistor R52 (resistance: $r_{52}$) constitute a second current mirror circuit. The transistors Q54 and Q57 are diode-connected. A current flowing through the resistor R52, i.e., a collector current of the transistors Q54 and Q57, serves as a reference current. A collector current $I_2$ of the transistor Q53 serves as a mirror current for the reference current.

The mirror current $I_2$ is expressed as $$(V_{STB}-2V_{BE54})/r_{52},$$

where $V_{BE54}$ is the base-to-emitter voltage (typically, 0.6 to 0.7 V) of the transistor Q54, because the transistor Q57 has the same base-to-emitter voltage $V_{BE57}$ as $V_{BE54}$.

Two pnp bipolar transistors Q55 and Q56 constitute a third current mirror circuit. The transistor Q55 is diode-connected. The mirror current $I_2$ of the second current mirror circuit flows through the transistor Q55 as a reference current of the third current mirror circuit. The current $I_2$ is folded by the third current mirror circuit, thereby producing a constant current $-I_2$ at a collector of the transistor Q56. Thus, a mirror current ($I_1$–$I_2$) of the third current mirror circuit is produced at the collector of the transistor Q56.

Two pnp bipolar transistors Q58 and Q59 constitute a fourth current mirror circuit. The transistor Q58 is diode-connected. A collector current of the transistor Q58, which is equal to the mirror current ($I_1$–$I_2$), serves as a reference current. A mirror current ($I_1$–$I_2$) serving as a reference current with a negative temperature coefficient is produced at a collector of the transistor Q59.

with the conventional current reference circuit shown in FIG. 1, the bias current for the diode-connected transistor Q51 varies in inverse proportion to the ambient absolute temperature because the base-to-emitter voltage $V_{BE51}$ of the transistor Q51 is inversely proportional to the ambient absolute temperature. The temperature coefficient of $V_{BE51}$ or the bias current for the transistor Q51 is approximately −2 mV/deg.

Similarly, the bias current for the diode-connected transistors Q54 and Q57 varies in inverse proportion to the ambient absolute temperature because the transistors Q54 and Q57 have the base-to-emitter voltages $V_{BE54}$ and $V_{BE57}$ that are inversely proportional to the ambient absolute temperature. $V_{BE54}$ and $V_{BE57}$ have the same temperature coefficient as that of $V_{BE51}$, and the transistors Q54 and Q57 are serially connected to each other. Therefore, the temperature coefficient of $V_{BE54}$ or the bias current for the transistors Q54 and Q57 is equal to twice as much as that of $V_{BE51}$, i.e., approximately −4 mV/deg.

Additionally, the supply voltage $V_{STB}$ needs to have no temperature coefficient.

The conventional current reference circuit of FIG. 1 has the following problem: Since the transistors Q54 and Q57 are serially connected between the supply voltage $V_{STB}$ and the ground, the supply voltage $V_{STB}$ is required to be greater than the sum (approximately 1.2 to 1.4 V) of the base-to-emitter voltages of the transistors Q54 and Q57. As a result, the supply voltage $V_{STB}$ needs to be equal to or greater than approximately 1.5 V. This means that the conventional circuit of FIG. 1 cannot be operated at a low supply voltage of approximately 1 V.

Moreover, there has been no inverse PTAT circuit operable at a low supply voltage of approximately 1 V.

SUMMARY OF THE INVENTION

Accordingly, an object of the present invention is to provide a current mirror circuit that can produce a constant current having a negative or positive temperature coefficient and that can be operated at a low supply voltage of approximately 1 V.

Another object of the present invention is to provide a current mirror circuit that can be readily realized on a semiconductor integrated circuit with a small circuit scale.

Still another object of the present invention is to provide a current reference circuit that can be operated at a low supply voltage of approximately 1 V.

A current mirror circuit according to a first aspect of the invention includes a first bipolar transistor having a base and a collector coupled together, and a second bipolar transistor having a base connected to the base of the first transistor. A resistor is connected to an emitter of the first transistor. The emitter of the first transistor is connected to an emitter of the second transistor through the resistor. A reference current is supplied to the collector of the first transistor, and a mirror current for the reference current is produced at a collector of the second transistor.

With the current mirror circuit according to the first aspect of the invention, the first transistor is diode-connected and has the resistor at its emitter, and the second transistor has the base connected to the base of the first transistor. The reference current is supplied to the collector of the first transistor and the mirror current is produced at the collector of the second transistor. As a result, this current mirror circuit can produce a constant current having a negative temperature coefficient.

Also, since no stacked transistors are required between the supply voltage and the ground, this current mirror circuit can be operated at a low supply voltage of approximately 1 V.

Further, because the circuit is made of the first and second transistors and the resistor, it is readily realized on a semiconductor integrated circuit with a small circuit scale.

A current mirror circuit according to a second aspect of the invention includes a first field-effect transistor (FET) having a gate and a drain coupled together, and a second FET having a gate connected to the gate of the first FET. A resistor is connected to a source of the first FET. The source of the first FET is connected to a source of the second FET through the resistor. A reference current is supplied to the drain of the first FET, and a mirror current of the reference current is produced at a drain of the second FET.

With the current mirror circuit according to the second aspect of the invention, the first FET is diode-connected and has the resistor at its source, and the second FET has the gate connected to the gate of the first FET. The reference current is supplied to the drain of the first FET and the mirror current is produced at the drain of the second FET. As a result, this current mirror circuit can produce a constant current having a negative temperature coefficient.

Also, since no stacked FETs are required between the supply voltage and the ground, this current mirror circuit can be operated at a low supply voltage of approximately 1 V.

Further, because the circuit is made of the first and second FETs and the resistor, it is readily realized on a semiconductor integrated circuit with a small circuit scale.

A current mirror circuit according to a third aspect of the invention includes a first bipolar transistor having a base and a collector connected through a first resistor to each other, and a second bipolar transistor having a base connected to the collector of the first transistor. A second resistor is connected to an emitter of the first transistor. The emitter of the first transistor is connected to an emitter of the second transistor through the second resistor. A reference current is supplied to the collector of the first transistor, and a mirror current for the reference current is produced at a collector of the second transistor.

With the current mirror circuit according to the third aspect of the invention, the first transistor is diode-connected through the first resistor and has the second resistor at its emitter. The second transistor has the base connected to the collector of the first transistor. The reference current is supplied to the collector of the first transistor through the first resistor, and the mirror current is produced at the collector of the second transistor. As a result, this current mirror circuit can produce a constant current having a negative or positive temperature coefficient, which is programmable by changing the resistances of the first and second resistors.

Also, since no stacked transistors are required between the supply voltage and the ground, this current mirror circuit can be operated at a low supply voltage of approximately 1 V.

Further, because the circuit is made of the first and second transistors and the first and second resistors, it is readily realized on a semiconductor integrated circuit with a small circuit scale.

A current mirror circuit according to a fourth aspect of the invention includes a first FET having a gate and a drain connected through a first resistor to each other, and a second FET having a gate connected to the gate of the first FET. A second resistor is connected to a source of the first FET. The source of the first FET is connected to a source of the second FET through the second resistor. A reference current is supplied to the drain of the first FET, and a mirror current of the reference current is produced at a drain of the second FET.

With the current mirror circuit according to the fourth aspect of the invention, the first FET is diode-connected through the first resistor and has the second resistor at its source. The second FET has the gate connected to the drain of the first FET. The reference current is supplied to the drain of the first FET through the first resistor. The mirror current is produced at the drain of the second FET. As a result, this current mirror circuit can produce a constant current having a negative or positive temperature coefficient, which is programmable by changing the resistances of the first and second resistors.

Also, since no stacked FETs are required between the supply voltage and the ground, this current mirror circuit can be operated at a low supply voltage of approximately 1 V.

Further, because the circuit is made of the first and second FETs and the first and second resistors, it is readily realized on a semiconductor integrated circuit with a small circuit scale.

In the current mirror circuits according to the first and third aspects, preferably, the first transistor has an emitter area whose value is $K_1$ times as much as that of the second transistor, where $K_1$ is a constant greater than unity. In this case, an advantage that the mirror current value can be controlled by the value of $K_1$ occurs.

In the current mirror circuits according to the second and fourth aspects, preferably, the first FET has a transconductance parameter β whose value is $K_2$ times as much as that of the second FET, where $K_2$ is a constant greater than unity. Here, β is expressed as $(C_{OX}/2)$ (W/L) where $\mu$ is the effective carrier mobility, $C_{OX}$ is the gate oxide capacitance per unit area, and W and L are a gate width and a gate length, respectively. In this case, an advantage that the mirror current value can be controlled by the value of $K_2$ occurs.

A current reference circuit according to a fifth aspect of the invention includes an inverse PTAT subcircuit and a PTAT subcircuit, both of which are mutually biased to each other. The PTAT subcircuit produces first and second constant currents having positive temperature coefficients. The inverse PTAT subcircuit is a current mirror circuit receiving the second constant current as a reference current and the first constant current as a mirror current. The first and second constant currents flow along a current path loop to cancel the positive temperature coefficients of the first and second constant currents.

With the current reference circuit according to the fifth aspect, the PTAT subcircuit and the inverse PTAT subcircuit are mutually biased. Also, the current mirror circuit serving as the inverse PTAT subcircuit is supplied with the second constant current as the reference current and the first constant current as the mirror current. The first and second constant currents flow along a current path loop to cancel their positive temperature coefficients. Therefore, a constant reference current having no temperature dependency is obtained.

Also, if the current mirror circuit can be operated at a low supply voltage of approximately 1 V, this current reference circuit can be operated at the same low supply voltage.

Here, the wording "mutually biasing" means that the inverse PTAT subcircuit is biased by the PTAT subcircuit and vice versa.

As the inverse PTAT subcircuit, any one of the current mirror circuits according to the first to fourth aspects is preferably used. However, any other one may be used.

As the PTAT subcircuit, any PTAT circuit (for example, a Widlar current mirror circuit) may be used.

DETAILED DESCRIPTION OF THE PREFERRED EMBODIMENTS

Figure 1:
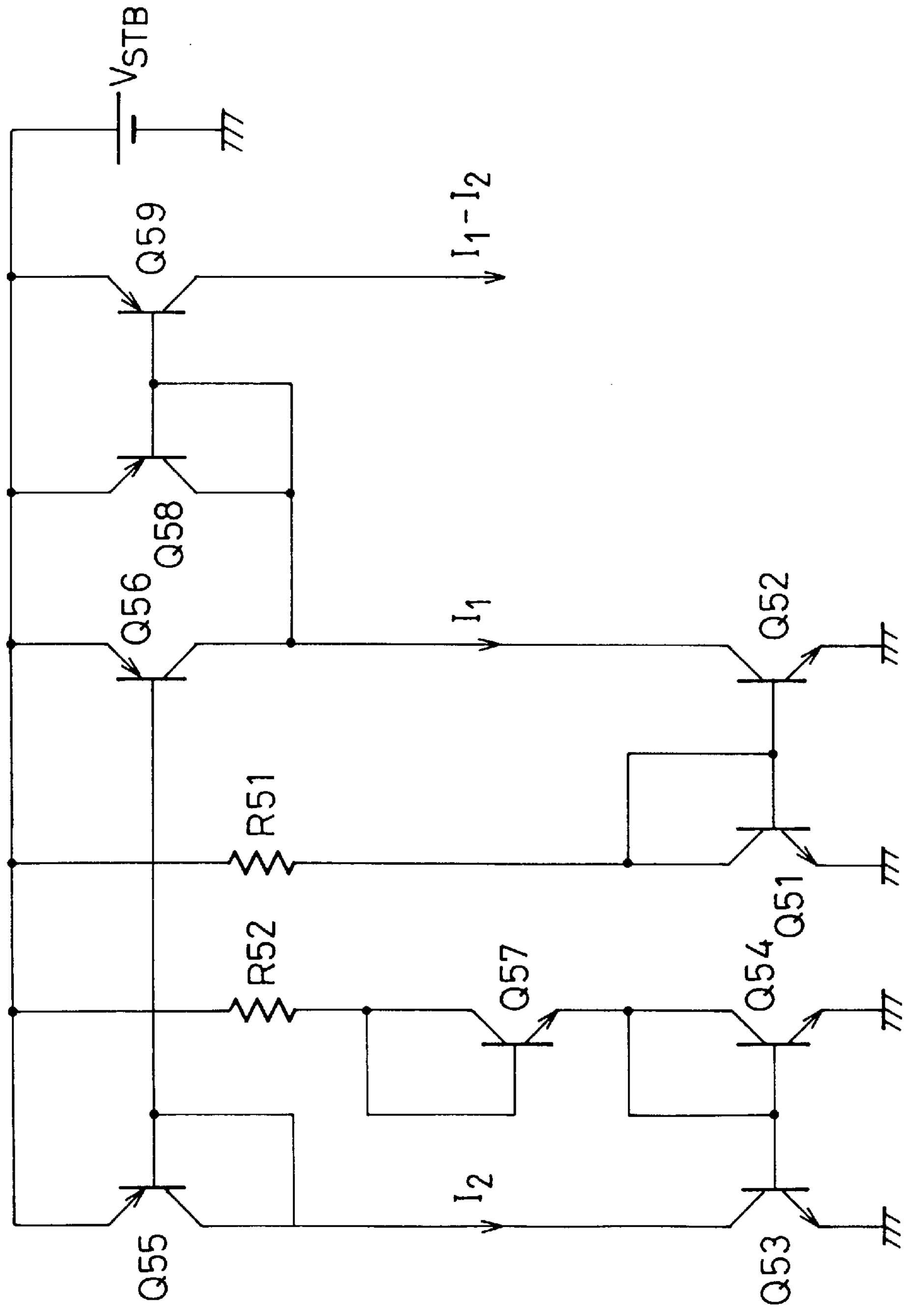
FIG. 1 PRIOR ART
FIG. 1 is a circuit diagram of a conventional current reference circuit.

Preferred embodiments of the present invention will be described below while referring to the drawings attached.

FIRST EMBODIMENT

Figure 2:
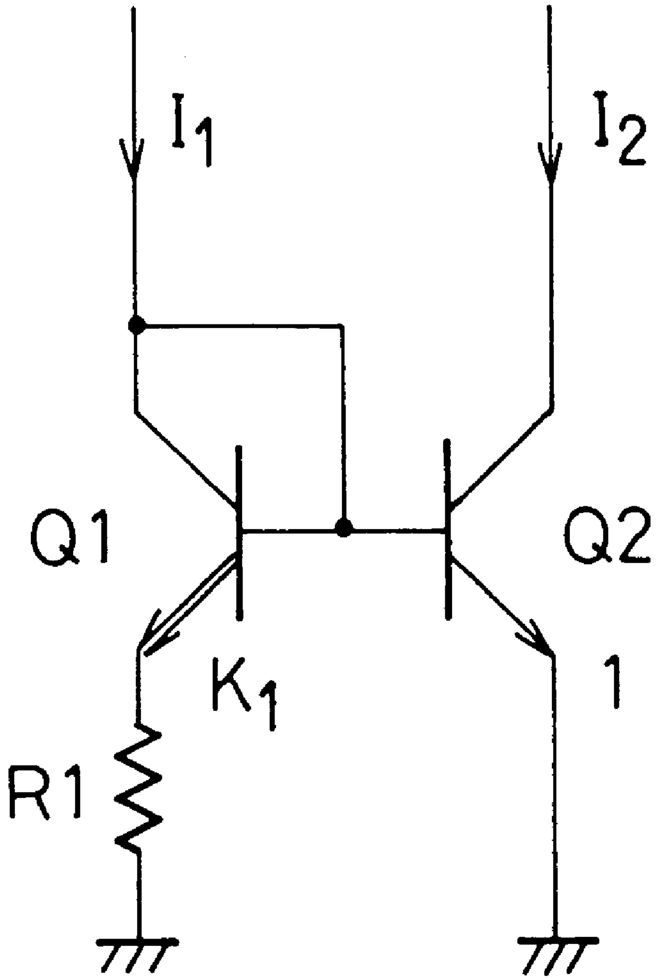
FIG. 2 is a circuit diagram of a current mirror circuit composed of bipolar transistors according to a first embodiment of the invention.

A current mirror circuit according to a first embodiment has a configuration as shown in FIG. 2, which may be termed an "inverse Widlar current mirror circuit".

The circuit includes an npn bipolar transistor Q1 having a base and a collector coupled together, and an npn bipolar transistor Q2 having a base connected to the base of the transistor Q1. A resistor R1 (resistance: $r_1$) is connected to an emitter of the transistor Q1. The emitter of the transistor Q1 is grounded through the resistor R1. An emitter of the transistor Q2 is directly grounded.

A reference current $I_1$ is supplied to the collector of the transistor Q1, and a mirror current $I_2$ for the reference current $I_1$ is produced at a collector of the transistor Q2.

The transistor Q1 has an emitter area of $K_1$ times as much as that of the transistor Q2, where $K_1$ is a constant greater than unity.

Next, the reason that the current mirror circuit shown in FIG. 2 produces the mirror current $I_2$ with a negative temperature coefficient is described below.

Supposing that the bipolar transistors Q1 and Q2 are matched in characteristic and ignoring the basewidth modulation (or, the Early effect), the collector current of the transistor Q1, i.e., the reference current $I_1$ can be expressed as the following equation (1).

$$I_1 = K_1 I_S \exp\left(\frac{V_{BE1}}{V_T}\right) \tag{1}$$

In the equation (1), $V_T$ is the thermal voltage of the transistor Q1 defined as $V_T=(kT)/q$ where k is the Boltzmann's constant, T is absolute temperature in degrees Kelvin, and q is the charge of an electron. Also, $I_S$ is the saturation current of the transistor Q1, $V_{BE1}$ is the base-to-emitter voltage of the transistor Q1.

The collector current of the transistor Q2, i.e., the miorror current $I_2$ can be expressed as the following equation (2) as $$I_2 = I_S \exp\left(\frac{V_{BE2}}{V_T}\right) \quad (2)$$

where $V_{BE2}$ is the base-to-emitter voltage of the transistor Q2.

Here, the base-to-emitter voltage $V_{BE2}$ of the transistor Q2 is equal to the sum of the base-to-emitter voltage $V_{BE1}$ of the transistor Q1 and the voltage drop ($r_1 \bullet I_1$) caused by the emitter resistor R1. Therefore, the difference $\Delta V_{BE}$ between base-emitter voltages $V_{BE1}$ and $V_{BE2}$ of the transistors Q1 and Q2 is expressed as the following equation (3).

$$\Delta V_{BE} = V_{BEI} - V_{BE2} = V_T \ln\left(\frac{K_1 I_2}{I_1}\right) = r_1 I_1 \quad (3)$$

Here, for the sake of the simplification of description, the dc common-base current gain factor $\alpha_F$ is set to be unity, i.e., $\alpha_F=1$.

By substituting the equations (1) and (2) into the equation (3), the following equation (4) showing the relationship between the currents $I_1$ and $I_2$ is obtained.

$$I_2 = \frac{I_1}{K} \exp\left(\frac{r_1 I_1}{V_T}\right) \quad (4)$$

If the equation (4) is differentiated by T, the temperature coefficient $TC_F(I_2)$ of the current $I_2$ is expressed as the following equation (5).

$$TC_F(I_2) = \frac{1}{I_2} \times \frac{d I_2}{d T} = -\frac{r_1 I_1 q}{kT^2} + \frac{I_1}{V_T} \times \frac{d r_1}{d T} \quad (5)$$

It is seen from the equation (5) that the temperature coefficient $TC_F(I_2)$ is negative, i.e., $TC_F(12)<0$, when the temperature coefficient of the resistor R1 is zero, i.e., ($dr_1/dT$)=0. This means that the mirror current $I_2$ of the current mirror circuit according to the first embodiment is inversely proportional to the ambient absolute temperature T, in other words, this circuit forms an inverse PTAT circuit.

Figure 3:
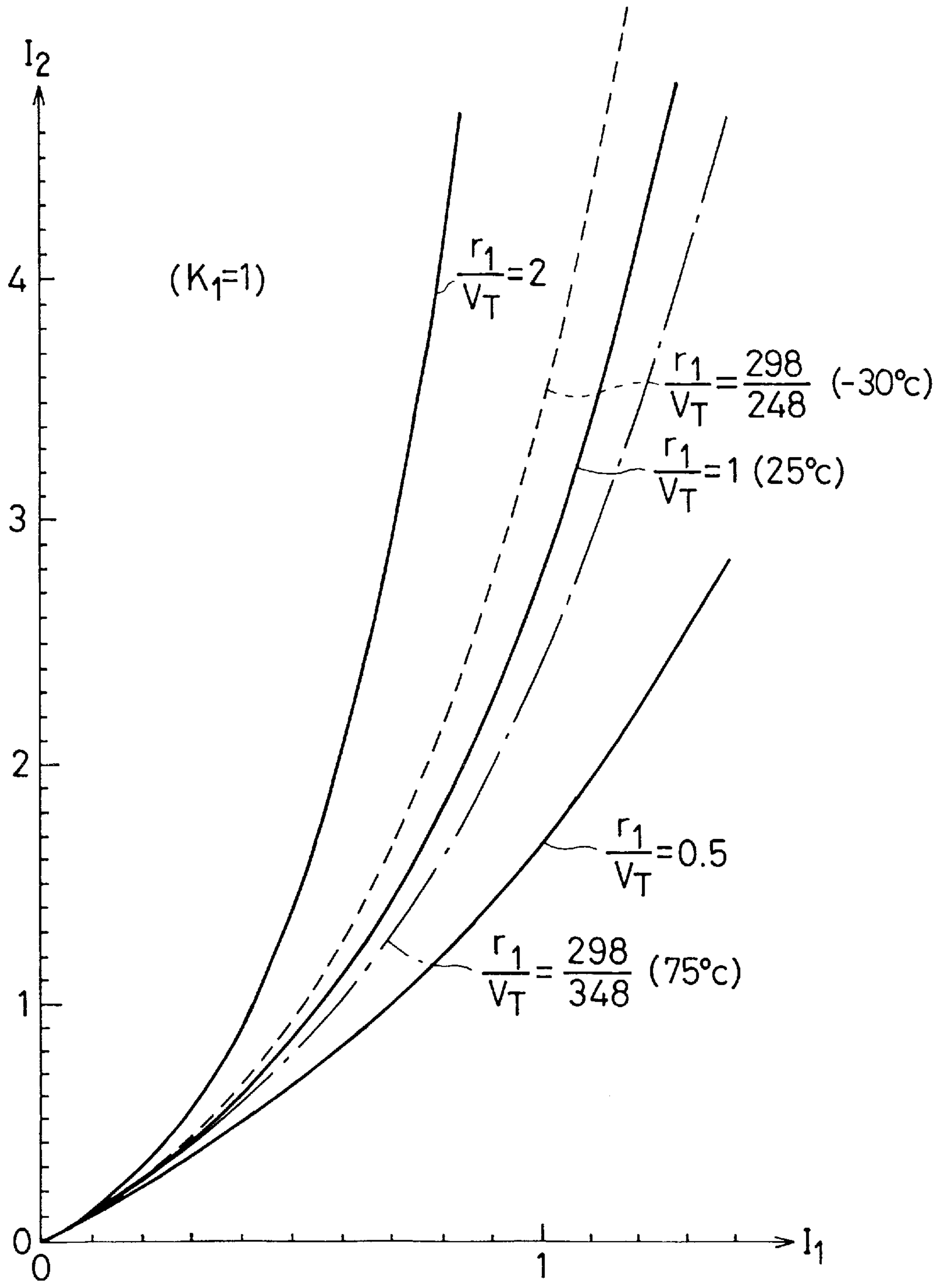
FIG. 3 is a graph showing the relationship between the reference and mirror currents $I_1$ and $I_2$ of the current mirror circuit of FIG. 2.

The relationship between the currents $I_1$ and $I_2$ according to the first embodiment is shown in FIG. 3, which was obtained by calculation. In FIG. 3, supposing that the curve at ($r_1/V_T$)=1 corresponds to the relationship at room temperature (25° C.), the curve at ($r_1/V_T$)=(298/248) corresponds to the relationship at −30° C., and the curve at ($r_1/V_T$)=(298/348) corresponds to the relationship at 75° C.

Figure 4:
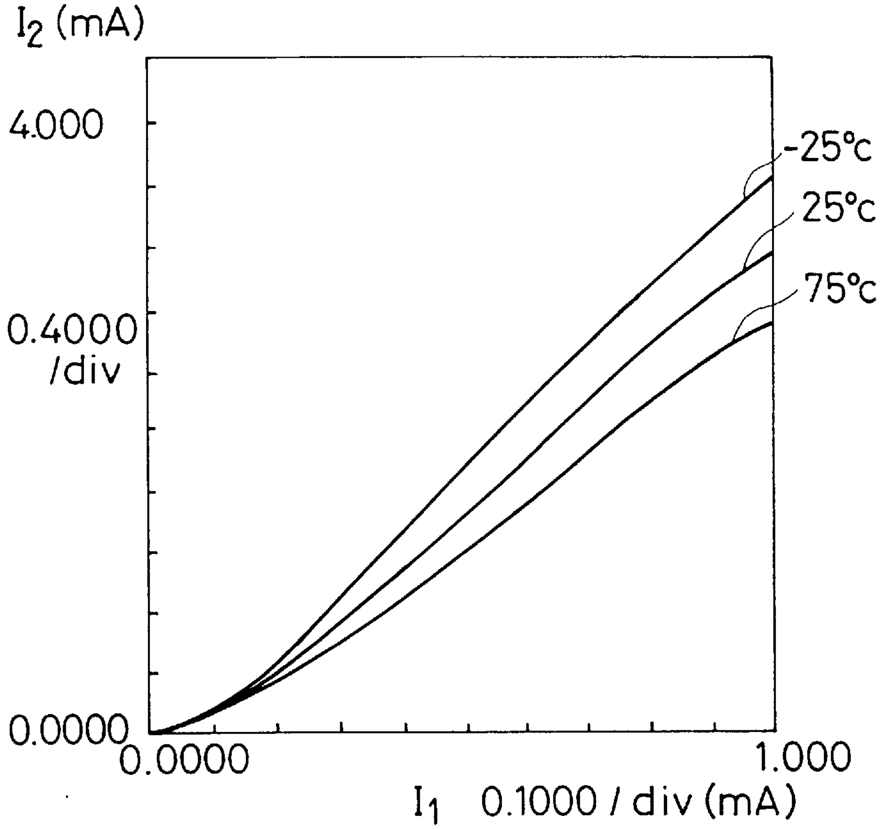
FIG. 4 is a graph showing the relationship between the reference and mirror currents $I_1$ and $I_2$ of the current mirror circuit of FIG. 2, which was obtained through a practical measurement.

Further, the relationship between the currents $I_1$ and $I_2$ according to the first embodiment is shown in FIG. 4, which was obtained by a practical measurement under the condition that $r_1$=100 Ω, $TC_F(I_2)$=−300 ppm/deg, $K_1$=1, and $V_{CE2}$=0.5 V, where $V_{CE2}$ is the collector voltage of the transistor Q2.

As described above, the current mirror circuit according to the first embodient can produce a constant current having a negative temperature coefficient. Also, since this circuit requires no serially connected transistors between the supply voltage and the ground, it can be operated at a low supply voltage such as 1 V.

Further, this current mirror circuit are composed of two bipolar transistors Q1 and Q2 and one resistor R1. As a result, it can be readily realized on a semiconductor integrated circuit with a small circuit scale.

The constant output currents $I_1$ and $I_2$ of this current mirror circuit may be used as a driving current for various functional blocks.

SECOND EMBODIMENT

Figure 5:
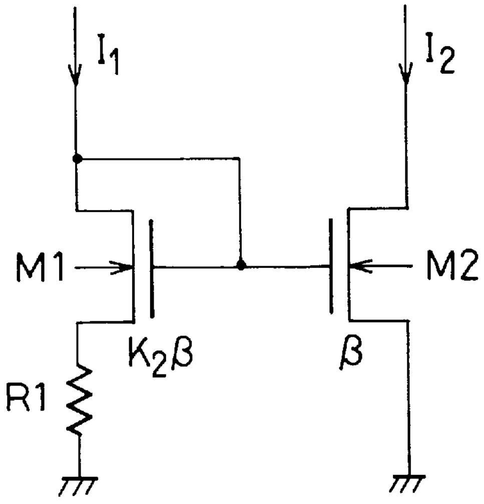
FIG. 5 is a circuit diagram of a current mirror circuit composed of metal-oxide-semiconductor (MOS) FETs (MOSFETs) according to a second embodiment of the invention, which is equivalent to a circuit obtained by replacing the respective bipolar transistors in the circuit of FIG. 2 by MOSFETs.

A current mirror circuit according to a second embodiment is shown in FIG. 5, which corresponds to one obtained by replacing the respective bipolar transistors in FIG. 2 with MOSFETS, respectively.

The current mirror circuit according to the second embodiment includes an n-channel MOSFET M1 having a gate and a drain coupled together, and an n-channel MOSFET M2 having a gate connected to the gate of the MOSFET M1. A resistor R1 (resistance: $r_1$) is connected to a source of the MOSFET M1. The source of the MOSFET M1 is grounded through the resistor R1. A source of the MOSFET M2 is directly grounded.

A reference current $I_1$ is supplied to the drain of the MOSFET M1, and a mirror current $I_2$ for the reference current $I_1$ is produced at a drain of the MOSFET M2.

The MOSFET M1 has a transconductance parameter $K_2$ times as much as that of the MOSFET M2, where $K_2$ is a constant greater than unity. Therefore, if the MOSFET M2 has the transconductance parameter β, the MOSFET M1 has the transconductance parameter $K_2\beta$.

Next, the reason that the current mirror circuit shown in FIG. 5 produces the mirror current $I_2$ having a negative temperature coefficient is described below.

Supposing that the MOSFETs M1 and M2 are matched in characteristic and ignoring the channel-length modulation and the body effect, the drain current $I_1$ of the MOSFET M1 can be expressed as the following equation (6).

$$I_1 = K_2 \beta (V_{GS1} - V_{TH})^2 \quad (6)$$

In the equation (6), $V_{TH}$ is the threshold voltage of the MOSFET M1, and $V_{GS1}$ is the gate-source voltage thereof.

Similarly, the drain current $I_2$ of the MOSFET M2 can be expressed by the following equation (7) as $$I_2 = \beta (V_{GS2} - V_{TH})^2 \quad (7)$$

where $V_{GS2}$ is the gate-source voltage of the MOSFET M2.

The difference between the gate-to-source voltages $V_{GS1}$ and $V_{GS2}$ satisfies the following relationship (8) as $$V_{GS2} - V_{GS1} = r_1 I_1 \quad (8)$$

Obtaining $V_{GS1}$ and $V_{GS2}$ from the equations (6) and (7) and substituting them into the equation (8), the mirror current $I_2$ can be expressed as the following equaiton (9).

$$I_2 = I_1 \left(\frac{1}{\sqrt{K_2}} + r_1 \sqrt{\beta I_1}\right)^2 \quad (9)$$

The equation (9) indicates the relationship between the reference and mirror currents $I_1$ and $I_2$ according to the second embodiment.

In the MOSFET, because the mobility $\mu$ has temperature dependence, the transconductance parameter β is expressed by the following equation (10):

$$\beta = \beta_0 \left(\frac{T}{T_0}\right)^{-\frac{3}{2}} \quad (10)$$

where β0 indicates a value of β at room temperature (300 K).

From the equation (10), the following equation (11) is obtained as $$\beta^{\frac{1}{2}} = \beta_0 \left( \frac{T}{T_0} \right)^{-\frac{3}{4}} \tag{11}$$

Figure 6:
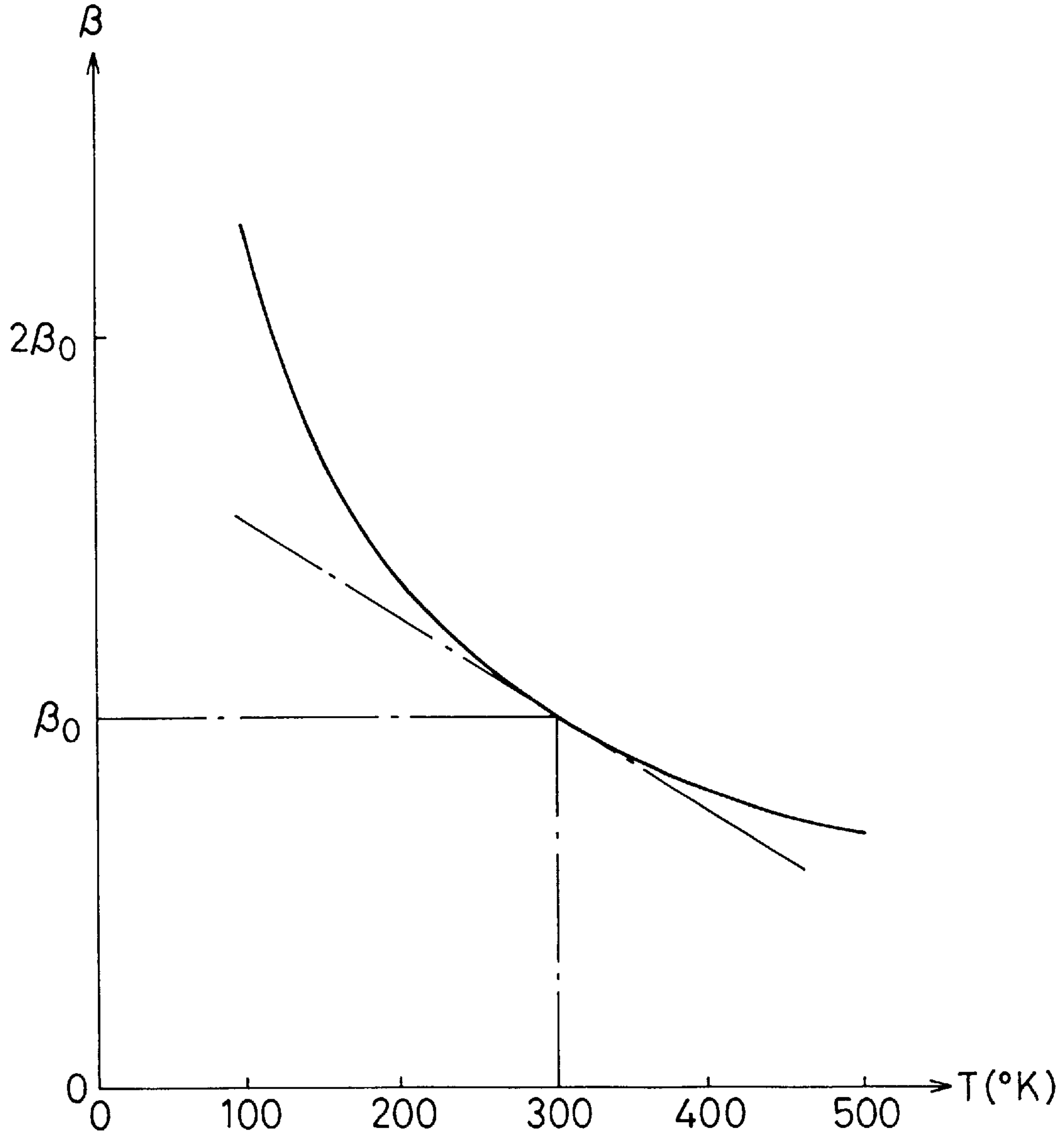
FIG. 6 is a graph showing the relationship between the ambient absolute temperature T and the transconductance parameter β of the current mirror circuit of FIG. 5.

FIG. 6 is a graph showing the relationship between β and T, which was obtained from the equation (11). It is seen from FIG. 6 that $\beta^{1/2}$ has a negative temperature coefficient. Therefore, if the relationship between the refrence and mirror currents $I_1$ and $I_2$ is drawn based on the equation (9), similar characteristics to those in FIG. 3 are obtained.

As described above, similar to the first embodiment, the current mirror circuit according to the second embodient can produce a constant current having a negative temperature coefficient. Also, since this circuit requires no serially connected MOSFETs between the supply voltage and the ground, it can be operated at a low supply voltage such as 1 V.

Further, this current mirror circuit are composed of two MOSFETs M1 and M2 and one resistor R1. As a result, it can be readily realized on a semiconductor integrated circuit with a small circuit scale.

THIRD EMBODIMENT

Figure 7:
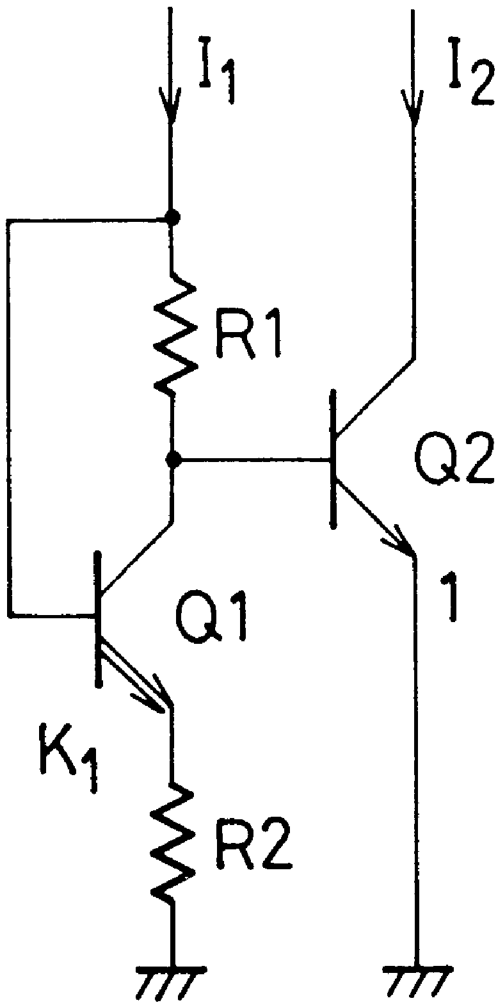
FIG. 7 is a circuit diagram of a current mirror circuit composed of bipolar transistors according to a third embodiment of the invention.

A current mirror circuit according to a third embodiment has a configuration as shown in FIG. 7.

In FIG. 7, the circuit includes an npn bipolar transistor Q1 having a base and a collector connected through a resistor R1 (resistance: $r_1$) to each other, and an npn bipolar transistor Q2 having a base connected to the collector of the transistor Q1. Another resistor R2 (resistance: $r_2$) is connected to an emitter of the transistor Q1. The emitter of the transistor Q1 is grounded through the resistor R2. An emitter of the transistor Q2 is directly grounded.

A reference current $I_1$ is supplied to the collector of the transistor Q1 through the resistor R1, and a mirror current $I_2$ for the reference current $I_1$ is produced at a collector of the transistor Q2.

The transistor Q1 has an emitter area of $K_1$ times as much as that of the transistor Q2, where $K_1$ is a constant greater than unity.

The collector currents $I_1$ and $I_2$ of the transistors Q1 and Q2 can be expressed as the above equations (1) and (2).

Here, supposing that the currents flowing through the resistors R1 and R2 are the same in value, in other words, the dc common-base current gain factor $\alpha_F$ is approximately equal to unity (i.e., $\alpha_F \approx 1$), the difference $\Delta V_{BE}$ between base-emitter voltages $V_{BE1}$ and $V_{BE2}$ of the transistors Q1 and Q2 can be expressed as $$\Delta V_{BE} = V_{BE2} - V_{BE1} = I_1(r_1 - r_2)$$

Therefore, using the equations (1) and (2), the following equation (12) is obtained.

$$I_2 = \frac{I_1}{K_1} \times \exp\left\{ \frac{(r_2 - r_1)I_1}{V_T} \right\} \tag{12}$$

Accordingly, by differentiating the equation (12) by T, the temperature coefficient $TC_F(I_2)$ is expressed as the following equation (13).

$$TC_F(I_2) = -\frac{(r_2 - r_1)I_1 q}{kT^2} + \frac{I_1}{V_T} \times \frac{d(r_2 - r_1)}{dT} \tag{13}$$

It is seen from the equation (13) that the temperature coefficient $TC_F(I_2)$ is negative, i.e., $TC_F(I_2)<0$, when the resistance $r_2$ is greater than the resistance $r_1$, i.e., $r_2>r_1$. This is similar to the first embodiment.

Also, it is seen that the temperature coefficient $TC_F(I_2)$ is positive, i.e., $TC_F(I_2)>0$, when the resistance $r_2$ is less than the resistance $r_1$, i.e., $r_2<r_1$. This is similar to the Nagata current mirror circuit.

When $r_2=r_1$, this circuit forms a simple current mirror circuit whose mirror current has no temperature dependency.

Thus, in the current mirror circuit according to the third embodiment, the temperature coefficient of the mirror current $I_2$ can be set positive or negative by changing the resistances $r_1$ and $r_2$.

As described above, the current mirror circuit according to the third embodiment can produce a constant current having a negative or positive temperature coefficient. Also, since this circuit requires no serially connected transistors between the supply voltage and the ground, it can be operated at a low supply voltage such as 1 V.

Further, this current mirror circuit are composed of two bipolar transistors Q1 and Q2 and two resistors R1 and R2. As a result, it can be readily realized on a semiconductor integrated circuit with a small circuit scale.

Figure 8:
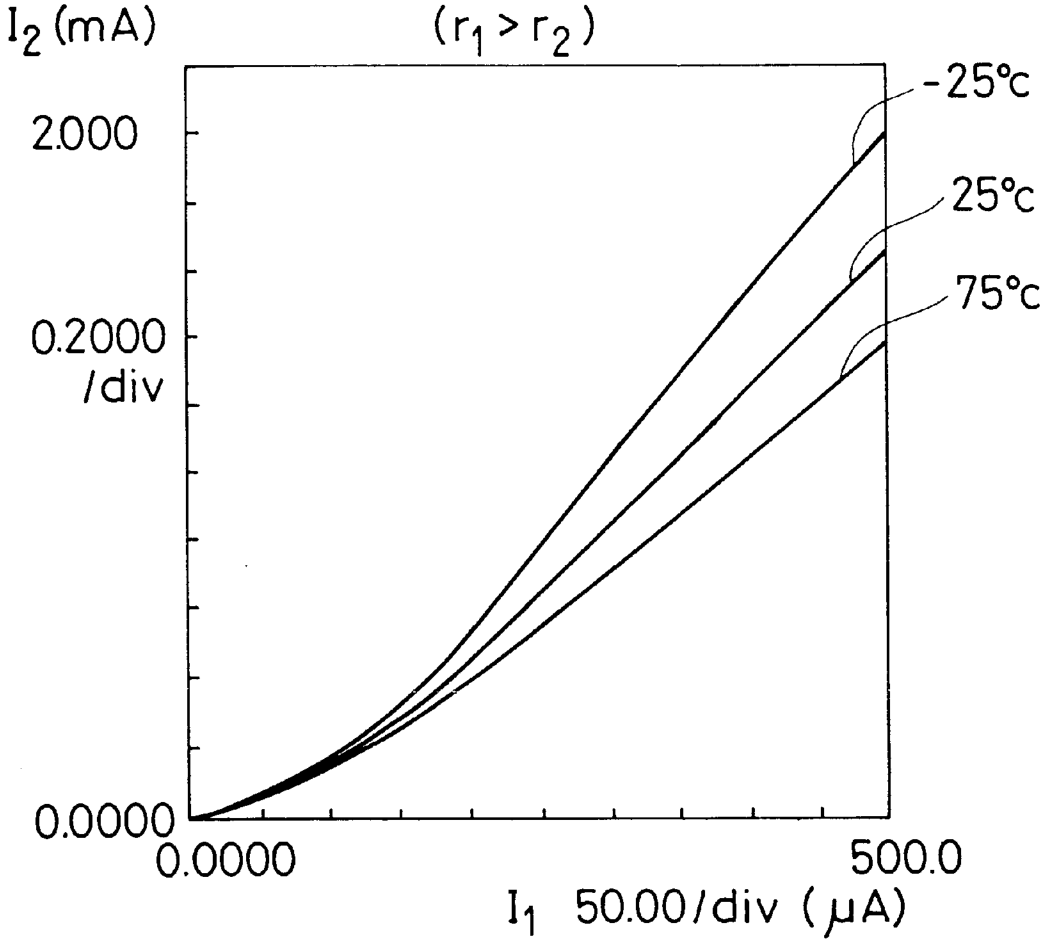
FIG. 8 is a graph showing the relationship between the reference and mirror currents $I_1$ and $I_2$ of the current mirror circuit of FIG. 7, which was obtained through a practical measurement.
Figure 9:
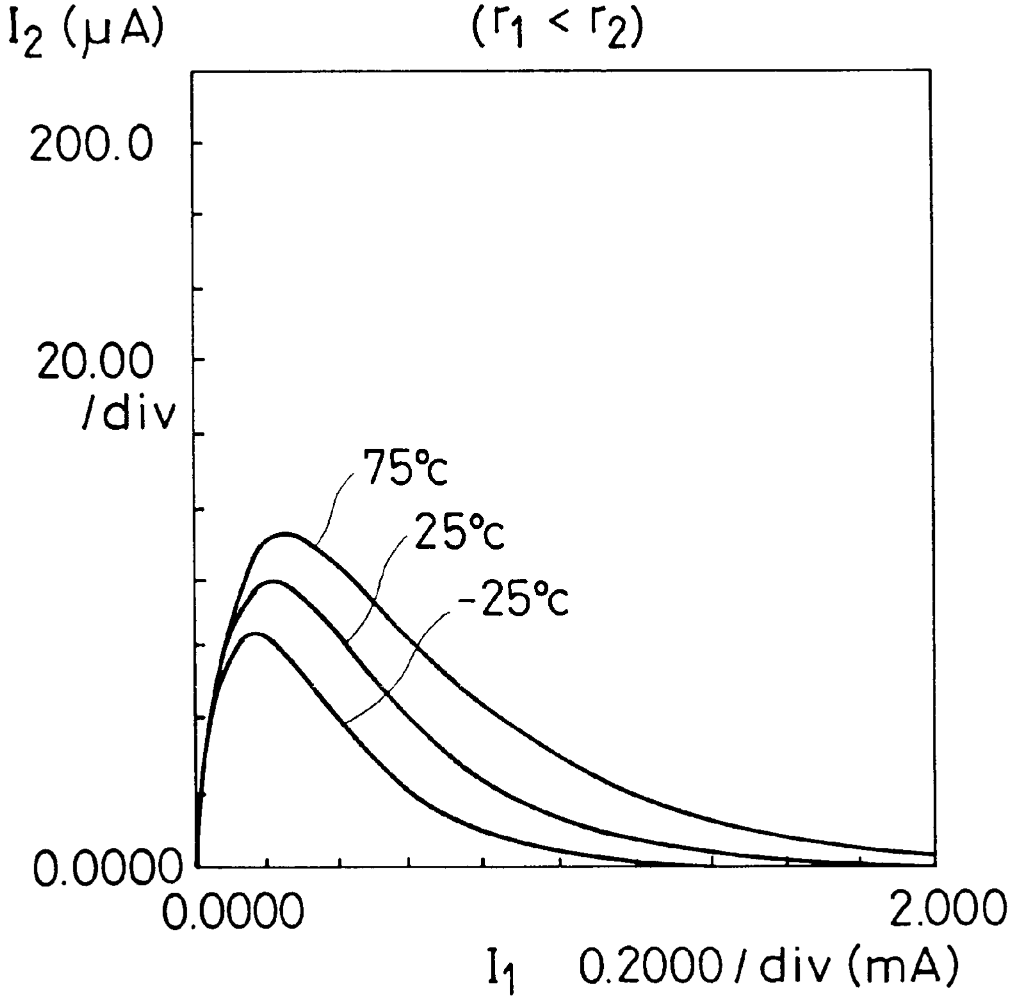
FIG. 9 is a graph showing the relationship between the reference and mirror currents $I_1$ and $I_2$ of the current mirror circuit of FIG. 7, which was obtained through another practical measurement.

FIGS. 8 and 9 show the relationship between the current $I_1$ and $I_2$ at −25° C., 25° C. and 75° C. according to the third embodiment, which was obtained by practical measurements.

FIG. 8 was obtained under the condition that $r_1$=180 Ω, $r_2$=50 Ω, $TC_F(I_2)$=−300 ppm/deg, $K_1$=1, and $V_{CE2}$=0.5 V, where $V_{CE2}$ is the collector voltage of the transistor Q2. It is seen from FIG. 8 that the current mirror circuit according to the third embodiment is equivalent to the inverse Widlar current mirror circuit when $r_1>r_2$.

FIG. 9 was obtained under the condition that $r_1$=50 Ω, $r_2$=180 Ω, $TC_F(I_2)$=−300 ppm/deg, $K_1$=1, and $V_{CE2}$=0.5 V. It is seen from FIG. 9 that the current mirror circuit according to the third embodiment is equivalent to the Nagata current mirror circuit when $r_1<r_2$.

FOURTH EMBODIMENT

Figure 10:
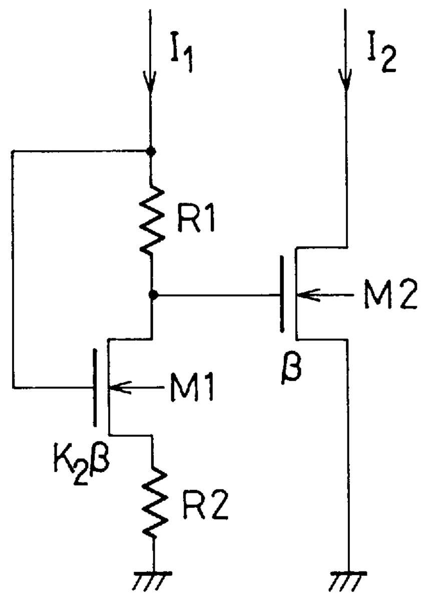
FIG. 10 is a circuit diagram of a current mirror circuit composed of MOSFETs according to a fourth embodiment of the invention, which is equivalent to a circuit obtained by replacing the respective bipolar transistors in the circuit of FIG. 7 by MOSFETs.

A current mirror circuit according to a fourth embodiment is shown in FIG. 10, which corresponds to one obtained by replacing the bipolar transistors in FIG. 7 with MOSFETs, respectively.

The current mirror circuit according to the fourth embodiment includes an n-channel MOSFET M1 having a gate and a drain connected through a resistor R1 (resistance: $r_1$) to each other, and an n-channel MOSFET M2 having a gate connected to the drain of the MOSFET M1. A resistor R2 (resistance: $r_2$) is connected to a source of the MOSFET M1. The source of the MOSFET M1 is grounded through the resistor R2. A source of the MOSFET M2 is directly grounded.

A reference current $I_1$ is supplied to the drain of the MOSFET M1 through the resistor R1, and a mirror current $I_2$ for the reference current $I_1$ is produced at a drain of the MOSFET M2.

The MOSFET M1 has a transconductance parameter $K_2$ times as much as that of the MOSFET M2, where $K_2$ is a constant greater than unity. Therefore, if the MOSFET M2 has the transconductance parameter β, the MOSFET M1 has the transconductance parameter $K_2\beta$.

In the similar manner to the third embodiment, the difference between the gate-to-source voltages $V_{GS1}$ and $V_{GS2}$ of the MOSFETs M1 and M2 satisfies the following relationship (14) as $$V_{GS2}-V_{GS1}=(r_2-r_1)I_1 \quad (14)$$

Also, because the drain currents $I_1$ and $I_2$ are expressed by the above equations (6) and (7), the following equations (15) and (16) are obtained by substituting the equations (6) and (7) into the equation (14).

$$I_2 = I_1\left\{\frac{1}{\sqrt{K_2}} + (r_2 - r_1)\sqrt{\beta I_1}\right\}^2 \; (r_2 \geq r_1) \quad (15)$$

$$I_2 = \beta(r_1 - r_2)^2 I_1\left\{\sqrt{I_1} - \frac{1}{(r_1 - r_2)\sqrt{\beta}}\right\}^2 \quad (16)$$

$$\left(I_1 \leq \frac{1}{r_2^2\beta}, r_1 \geq r_2\right)$$

The relationship between the current $I_1$ and $I_2$ according to the fourth embodiment are given by the equations (15) and (16). It is seen from the equations (15) and (16) that the temperature coefficient of $I_2$ is negative when $r_2 \leqq r_1$, which means that this circuit is an inverse PTAT circuit. Also, it is seen that the temperature coefficient of $I_2$ is positive when $r_2 \geqq r_1$, which means that this circuit becomes a PTAT circuit. The detailed analysis was described in IEICE Transactions on Fundamentals, Vol. E77-A, No. 2, pp 398–402, February 1994.

Thus, also in the current mirror circuit according to the fourth embodiment, the temperature coefficient of the mirror current $I_2$ can be set positive or negative by changing the resistances $r_1$ and $r_2$.

As described above, the current mirror circuit according to the fourth embodient can produce a constant current having a negative or positive temperature coefficient. Also, since this circuit requires no serially connected MOSFETs between the supply voltage and the ground, it can be operated at a low supply voltage such as 1 V.

Further, this current mirror circuit are composed of two MOSFETs M1 and M2 and two resistors R1 and R2. As a result, it can be readily realized on a semiconductor integrated circuit with a small circuit scale.

FIFTH EMBODIMENT

Figure 11:
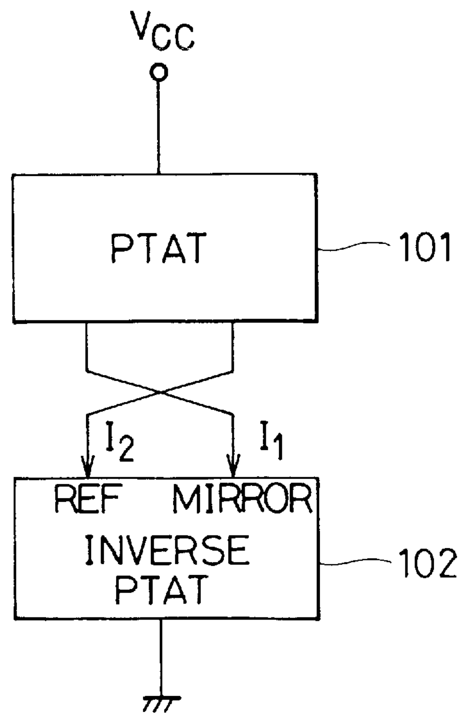
FIG. 11 is a schematic block diagram of a current reference circuit according to the invention.

FIG. 11 schematically shows a block diagram of a current reference circuit according to the present invention. This current reference circuit contains a PTAT constant current subcircuit 101 and an inverse PTAT constant current subcircuit 102. These subcircuits 101 and 102 are serially connected to each other and mutually biased to each other between a supply voltage $V_{CC}$ and the ground.

The PTAT subcircuit 101 is biased by a constant current supplied from a start-up circuit (not shown), thereby enabling the subcircuit 101 to operate at a specified, stable operating point. The inverse PTAT subcircuit 102 is driven by the PTAT subcircuit 101. The start-up circuit is preferably formed by a Nagata current mirror circuit.

The PTAT subcircuit 101 generates two constant output currents having positive temperature coefficients. The inverse PTAT subcircuit 102 generates two constant output currents having negative temperature coefficients as a mirror current and a reference current. The output currents flow along a current path loop.

The positive temperature coefficients of the output currents from the PTAT subcircuit 101 may be cancelled by the negative temperature coefficients of the output currents from the inverse PTAT subcircuit 102, thereby producing a reference current having no temperature dependence i.e., a temperature coefficient of zero.

The PTAT subcircuit 101 may be formed by a well-known Widlar current mirror circuit, a Nagata current mirror circuit, a current flowing through a base-biasing resistor for a bipolar transistor driven by a constant current, or the like.

The inverse PTAT subcircuit 102 is formed by a current mirror circuit according to the present invention.

Figure 12:
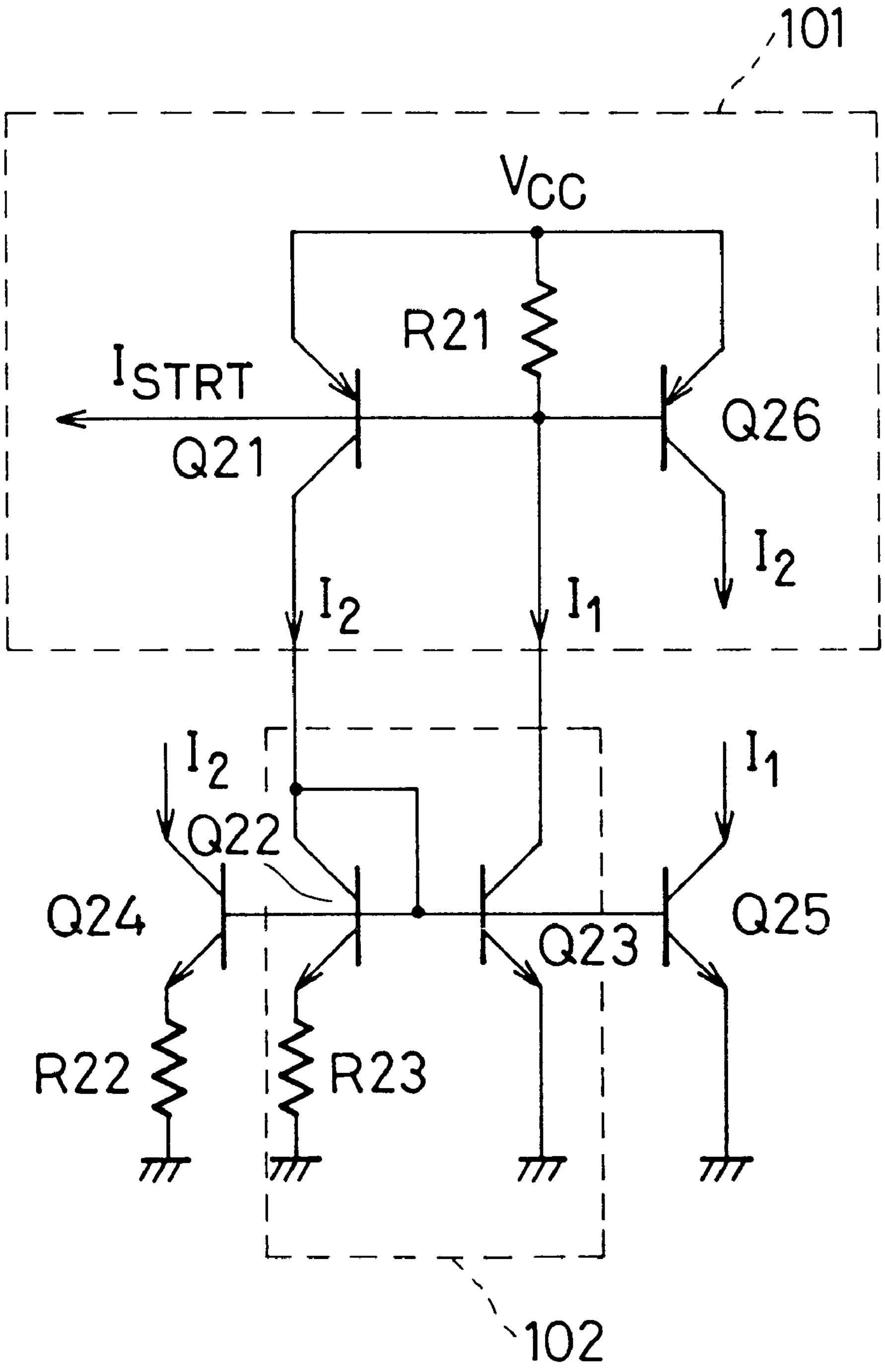
FIG. 12 is a circuit diagram of a current reference circuit composed of bipolar transistors according to a fifth embodiment of the invention.

FIG. 12 shows a current reference circuit according to a fifth embodiment, which generates a reference current having no temperature dependence and another reference current having a negative temperature coefficient.

In FIG. 12, the PTAT subcircuit 101 is composed of pnp bipolar transistors Q21 and Q26 and a resistor R21 (resistance: $r_{21}$). Bases of the transistors Q21 and Q26 are coupled together. Emitters of the transistors Q21 and Q26 are coupled together to be applied with a supply voltage $V_{CC}$. One end of the resistor R21 is connected to the coupled bases of the transistors Q21 and Q26 and the other end is connected to the coupled emitters thereof to be applied with $V_{CC}$.

The resistor R21 is a base-biasing resistor for the transistor Q26. A constant current $I_1$ flowing through the resistor R21 is supplied to the inverse PTAT subcircuit 102 as a mirror current.

A start-up current $I_{STRT}$, which is generated by a start-up circuit (not shown) such as a Nagata current mirror circuit, is supplied to the coupled bases of the transistors Q21 and Q26.

The inverse PTAT subcircuit 102 is composed of npn bipolar transistors Q22 and Q23 and a resistor R23 (resistance: $r_{23}$). A base and a collector of the transistor Q22 are coupled together to be connected to a collector of the transistor Q21. A constant current $I_2$ is supplied from the transistor Q21 to the collector of the transistor Q22 as a reference current. A base of the transistor Q23 is connected to the base of the transistor Q22. An end of the resistor R23 is connected to an emitter of the transistor Q22, and the other end is directly grounded. An emitter of the transistor Q23 is directly grounded.

Bases of npn bipolar transistors Q24 and Q25 are connected to the coupled bases of the transistors Q22 and Q23. A resistor R22 (resistance: $r_{22}=r_{23}$) is connected between an emitter of the transistor Q24 and the ground. An emitter of the transistor Q25 is directly grounded. As a result, the constant current $I_2$ is taken out at a collector of the transistor Q24, and the constant current $I_1$ is taken out at a collector of the transistor Q25.

The subcircuit 102 has the same configuration as that of the first embodiment shown in FIG. 2 where $K_1=1$.

The base-to-emitter voltage $V_{BE21}$ of the transistor Q21 has a negative temperature coefficient of about −2 mV/deg. Also, $I_1 \bullet r_{21}=V_{BE21}$ is established for the resistor R21. Therefore, the following equation (17) is obtained as $$\frac{d(I_1 r_{21})}{dT} = r_{21}\frac{dI_1}{dT} + I_1\frac{dr_{21}}{dT} = -2\ \text{mV/deg} \quad (17)$$

In the equation (17), if the resistance $r_{21}$ has a temperature coefficient of zero and the base-to-emitter voltage $V_{BE21}$ is approximately 600 mV at room temperature, the temperature coefficient $TC_F$ ($I_1$) for $I_1$ is equal to (2/600)≈−3.333 ppm/deg. Accordingly, the current reference circuit according to the fifth embodiment produces the reference current $I_1$ having a negative temperature coefficicent and the reference current $I_2$ having no temperature dependency.

Figure 13:
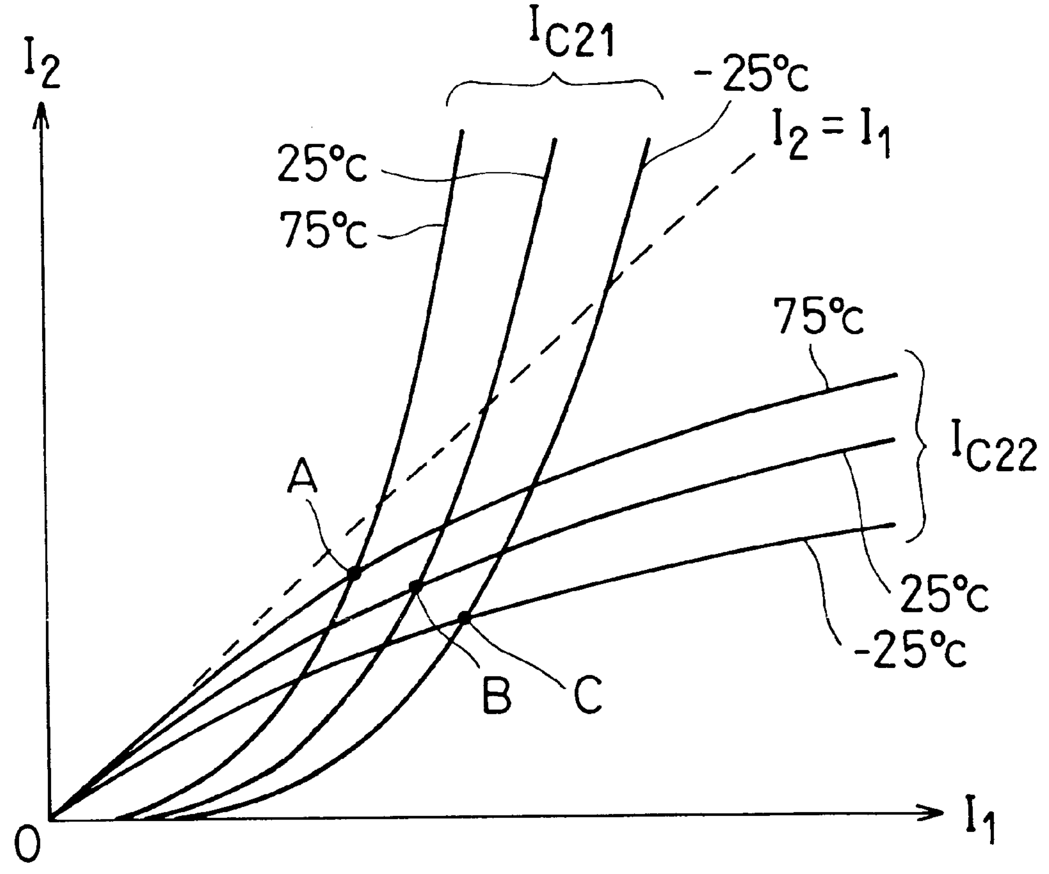
FIG. 13 is a graph showing the relationship between the reference and mirror currents $I_1$ and $I_2$ of the current reference circuit of FIG. 12.

FIG. 13 shows the relationship between the currents $I_1$ and $I_2$, in which $I_{C21}$ is a collector current of the transistor Q21 and $I_{C22}$ is a collector current of the transistor Q22. The operating point of the transistor Q21 is set at the point A, B or C which are defined by the intersections of the $I_{C21}$ curves and $I_{C22}$ curves. It is seen from FIG. 14 that the operating point changes with the ambient temperature.

SIXTH EMBODIMENT

Figure 14:
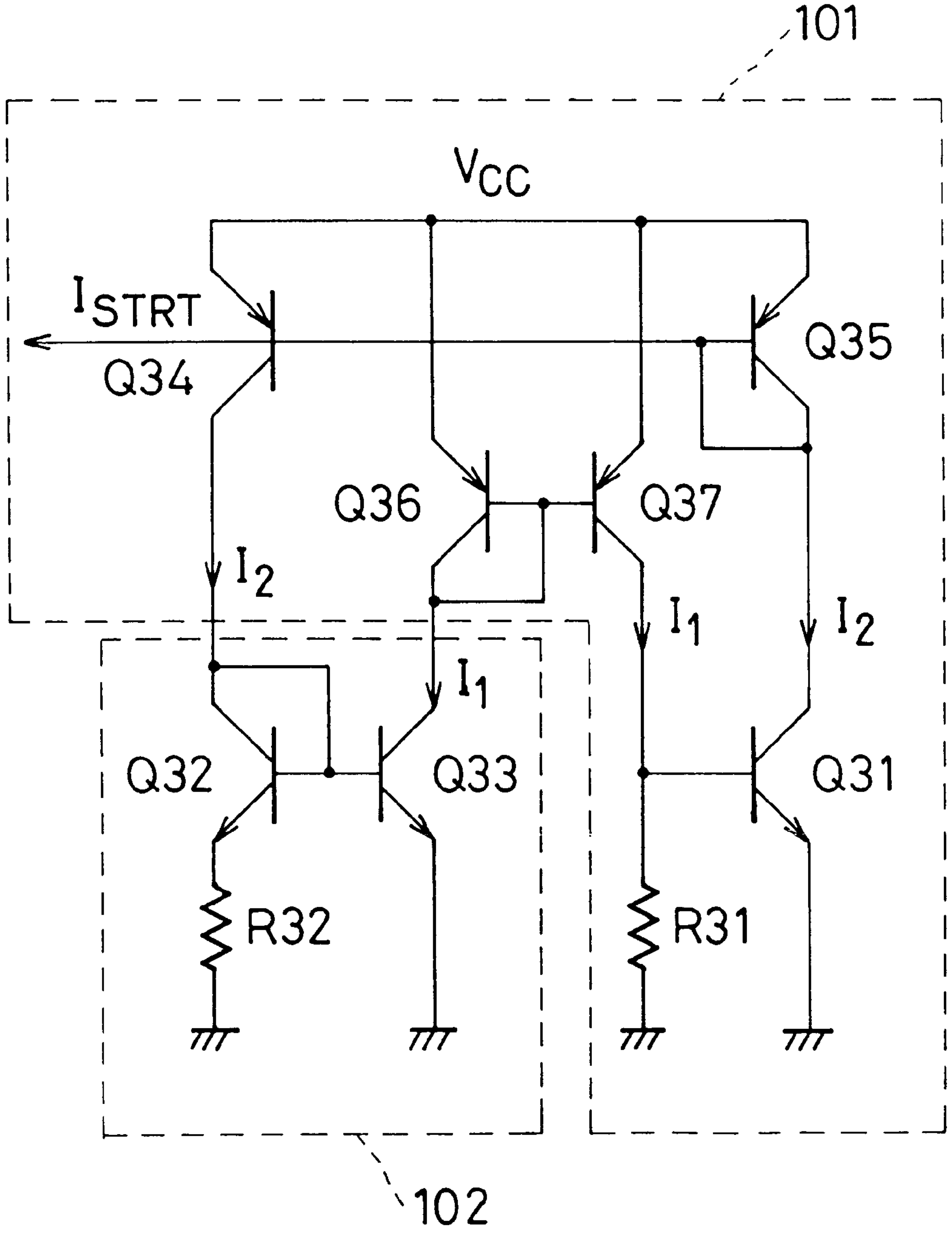
FIG. 14 is a circuit diagram of a current reference circuit composed of bipolar transistors according to a sixth embodiment of the invention.

FIG. 14 shows a current reference circuit according to a sixth embodiment, which generates a reference current having no temperature dependence and another reference current having a negative temperature coefficient.

In FIG. 14, the PTAT subcircuit 101 is composed of a first simple current mirror circuit made of pnp bipolar transistors Q34 and Q35, a second simple current mirror circuit made of pnp bipolar transistors Q36 and Q37, a npn bipoalr transistor Q31, and a base-biasing resistor R31 (resistance: $r_{31}$) for the transistor Q31. The transistors Q35 and Q36 are diode-connected.

The inverse PTAT subcircuit 102 is composed of npn bipolar transistors Q32 and Q33 and a resistor R33 (resitance: $r_{33}$). A base and a collector of the transistor Q32 are coupled togehther to be connected to a collector of the transistor Q34. An end of the resistor R32 is connected to an emitter of the transistor Q32, and the other end is directly grounded. An emitter of the transistor Q33 is directly grounded. The subcircuit 102 has the same configuration as that of the first embodiment shown in FIG. 2 where $K_1$=1.

A constant current $I_1$ flowing through the resistor R31 is supplied to the inverse PTAT subcircuit 102 as a mirror current through the second current mirror circuit of Q36 and Q37.

A start-up current $I_{STRT}$, which is generated by a start-up circuit (not shown) such as a Nagata current mirror circuit, is supplied to the coupled bases of the transistors Q34 and Q35. A constant current $I_2$ is supplied from the transistor Q35 to the collector of the transistor Q32 as a reference current through the first current mirror circuit of the transistors Q34 and Q35.

Similar to the fifth embodiment, the current reference circuit according to the sixth embodiment produces the reference current $I_1$ having a negative temperature coefficient and the reference current $I_2$ having no temperature dependency.

The current reference circuit according to the sixth embodiment also has the relationship between the currents $I_1$ and $I_2$ as shown in FIG. 13.

SEVENTH EMBODIMENT

Figure 15:
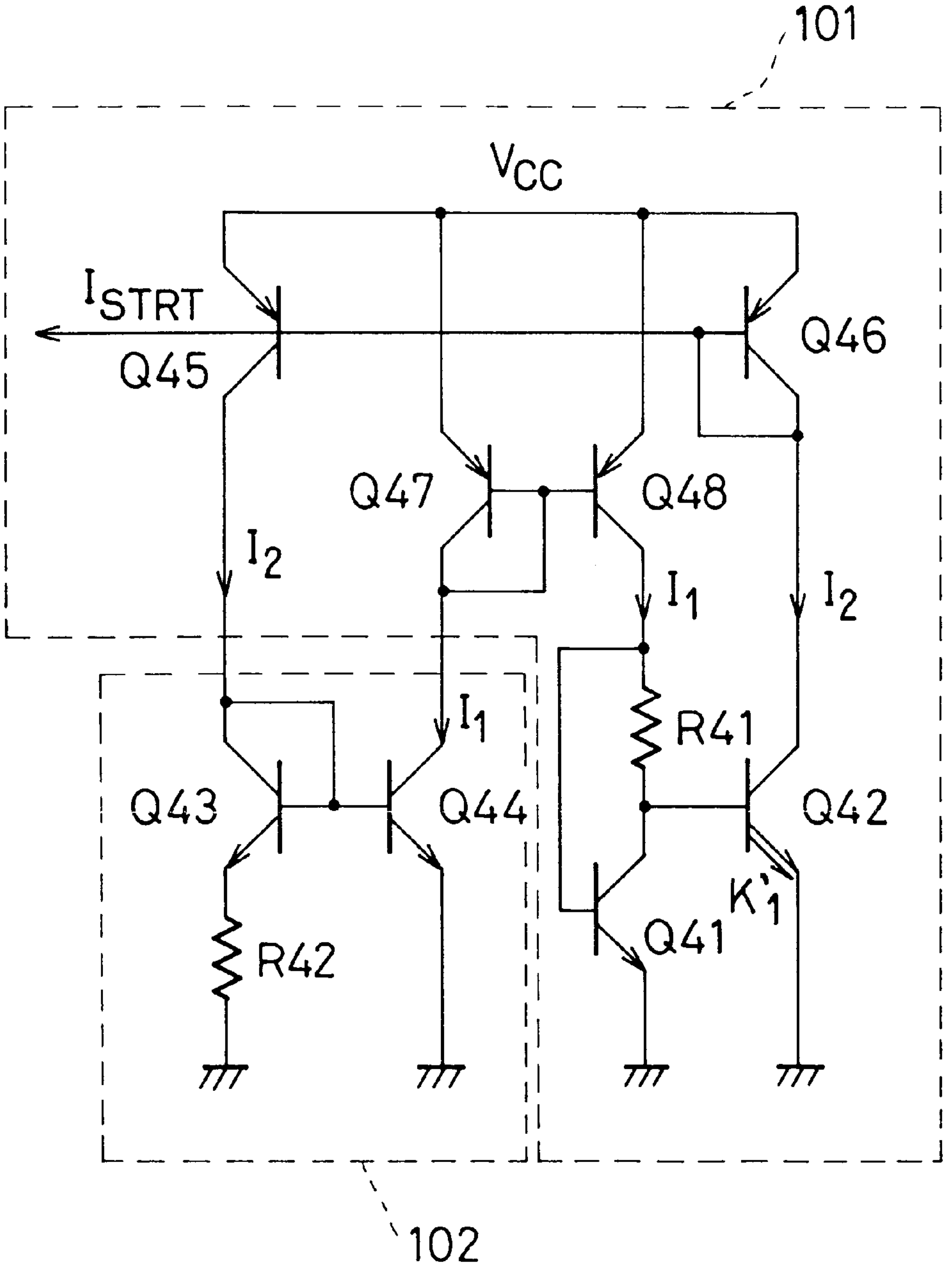
FIG. 15 is a circuit diagram of a current reference circuit composed of bipolar transistors according to a seventh embodiment of the invention.

FIG. 15 shows a current reference circuit according to a seventh embodiment, which generates a reference current having no temperature dependence and another reference current having a negative temperature coefficient.

In FIG. 15, the PTAT subcircuit 101 is composed of a Nagata current mirror circuit made of npn bipolar transistors Q41 and Q42 and a resistor R41 (resistance: $r_{41}$), a first simple current mirror circuit made of pnp bipolar transistors Q45 and Q46, and a second simple current mirror circuit made of pnp bipolar transistor Q47 and Q48. The transistors Q41, Q47 and Q46 are diode-connected.

The inverse PTAT subcircuit 102 is composed of npn bipolar transistors Q43 and Q44 and a resistor R42 (resistance: $r_{42}$). A base and a collector of the transistor Q43 are coupled together to be connected to a collector of the transistor Q45. An end of the resistor R42 is connected to an emitter of the transistor Q43, and the other end is directly grounded. An emitter of the transistor Q44 is directly grounded. The subcircuit 102 has the same configuration as that of the first embodiment shown in FIG. 2 where $K_1$=1.

A constant current $I_1$ flowing through the transistor Q41 is supplied to the inverse PTAT subcircuit 102 as a mirror current through the second simple current mirror circuit made of the transistors Q47 and Q48.

A start-up current $I_{STRT}$, which is generated by a start-up circuit (not shown) such as a Nagata current mirror circuit, is supplied to the coupled bases of the transistors Q45 and Q46. A constant current $I_2$ is supplied from the transistor Q46 to the collector of the transistor Q43 as a reference current through the first simple current mirror circuit made of the transistors Q45 and Q46.

Similar to the fifth embodiment, the current reference circuit according to the seventh embodiment produces the reference current $I_1$ having a negative temperature coefficient and the reference current $I_2$ having no temperature dependency.

The constant currents $I_1$ and $I_2$ produced by the Nagata current mirror circuit made of the transistors Q41 and Q42 and the resistor R41 are expressed by the following equations (18a) and (18b) as $$I_1 = I_s \exp\left(\frac{V_{BE41}}{V_T}\right) \tag{18 a}$$

$$I_2 = K_1' I_s \exp\left(\frac{V_{BE42}}{V_T}\right) \tag{18 b}$$

where $V_{BE41}$ and $V_{BE42}$ are the base-to-emitter voltages of the transistors Q41 and Q42, respectively.

According to the Kirchhoff's law, the following equation (19) is established as $$V_{BE41} - V_{BE42} = r_{41} I_1 \tag{19}$$

From the equations (18a), (18b) and (19), the following equation (20) is obtained.

$$I_2 = K_1' I_1 \exp\left(-\frac{r_{41} I_1}{V_T}\right) \tag{20}$$

If the equation (20) is differentiated by $I_1$ and $(dI_2/dI_1)$=0 is substituted thereinto, the following equation (21) is obtained.

$$r_{41} I_1 = V_T \tag{21}$$

From the equations (20) and (21), the peak value of the current $I_2$ is given by the following equation (22) as $$I_2 = \frac{K_1'}{e} I_1 = \frac{K_1'}{e} \times \frac{V_T}{r_{41}} \tag{22}$$

From the equation (22), it is seen that the peak value of $I_2$ of the Nagata current mirror circuit is approximately equal to the value of $I_1$ if the constant $K_1$' showing the emitter area ratio is e (≈2.7183≈11/4).

The temperature coefficient $TC_F(I_2)$ of the Nagata current mirror circuit is given by the following equation (23).

$$TC_F(I_2) = \frac{1}{I_2} \times \frac{dI_2}{dT} = \frac{r_{41} I_1 q}{kT^2} - \frac{I_1}{V_T} \times \frac{dr_{41}}{dT} \tag{23}$$

It is seen from the equation (23) that $TC_F(I_2)>0$ when $(dr_{41}/dT)=0$. This means that the mirror current $I_2$ of the Nagata current mirror circuit is proportional to the ambient absolute temperature, in other words, this circuit is a PTAT circuit.

In the seventh embodiment, the Nagata current mirror circuit is designed to operate at an operating point that is located outside its peak point, thereby forming a negative-feedback current loop to stabilize the operation.

Figure 16:
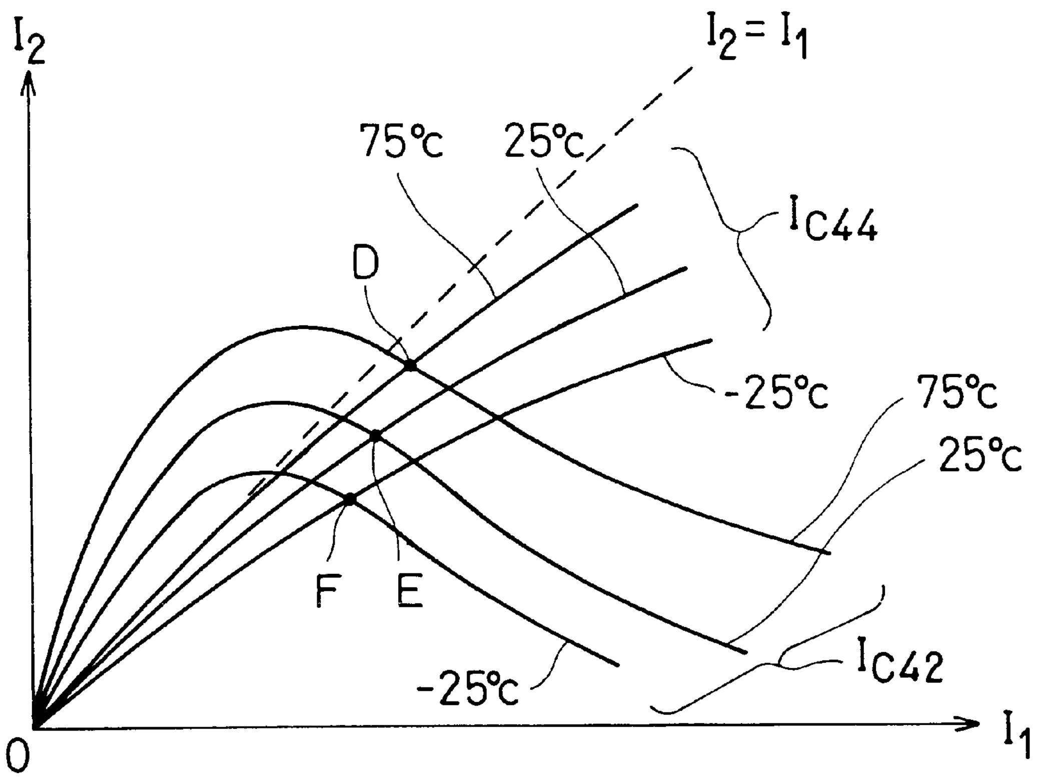
FIG. 16 is a graph showing the relationship between the reference and mirror currents $I_1$ and $I_2$ of the current reference circuit of FIG. 15.

FIG. 16 shows the relationship between the currents $I_1$ and $I_2$, in which $I_{C42}$ is a collector current of the transistor Q42 and $I_{C44}$ is a collector current of the transistor Q44. The operating point of the Nagata current mirror circuit is set at the point D, E or F which are defined by the intersections of the $I_{C42}$ curves and $I_{C44}$ curves. It is seen from FIG. 16 that the operating point changes with the ambient temperature.

If the base-to-emitter voltage $V_{BE41}$ of the transistor Q41 is equal to or greater than 600 mV at room temperature, and the resistances $r_{41}$ and $r_{42}$ have negative temperature coefficients, $TC_F(I_2)$ is greater than −3.333 ppm/deg. Therefore, the mirror current $I_2$ has a positive temperature coefficient. In this case, for the current reference circuits according to the fifth to seventh embodiments, the temperature dependency of the output current can be cancelled by adding suitable weights to the output currents having a positive temperataure coefficient and a negative temperature coefficient.

EIGHTH EMBODIMENT

Figure 17:
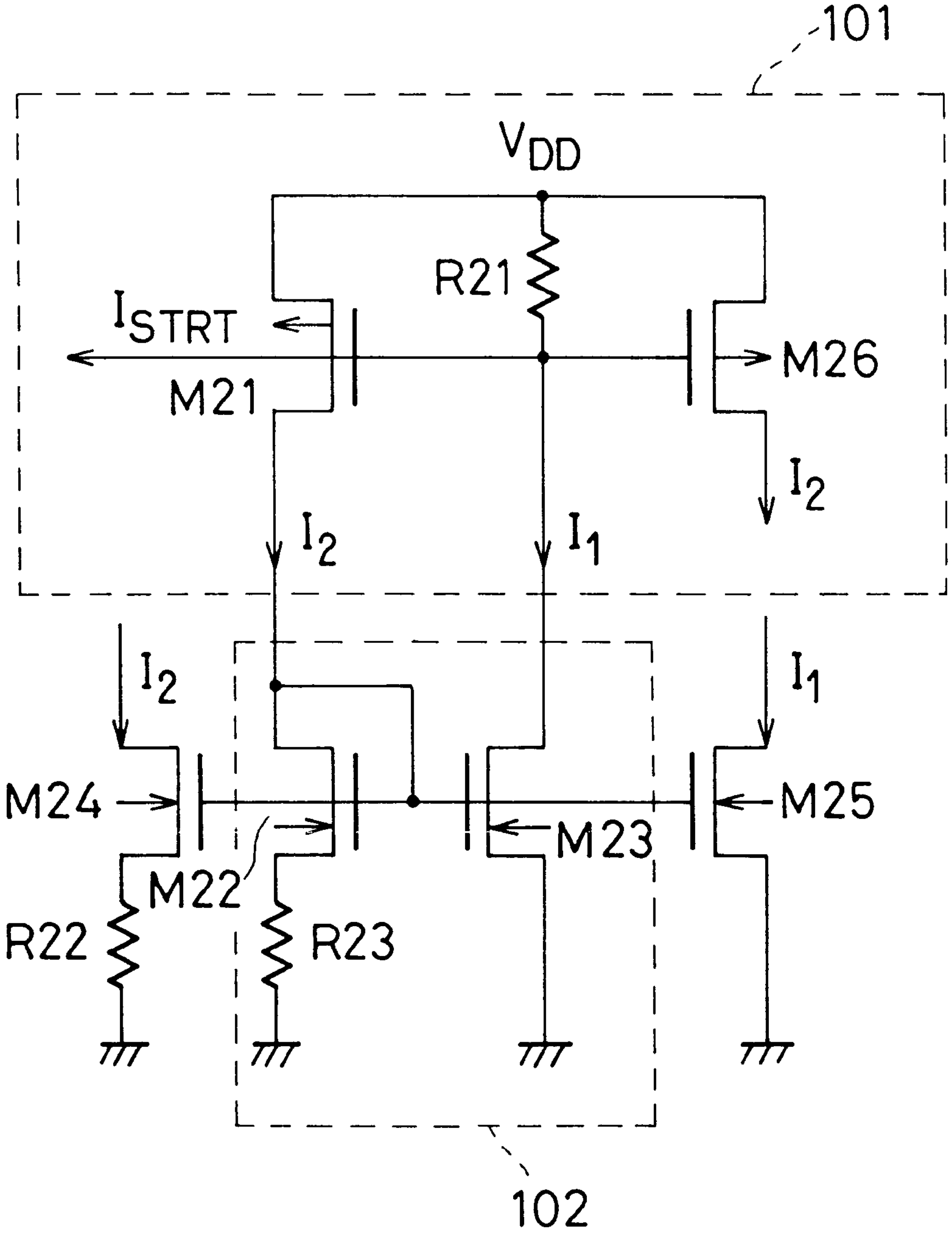
FIG. 17 is a circuit diagram of a current reference circuit composed of MOSFETs according to an eighth embodiment of the invention, which is equivalent to a circuit obtained by replacing the respective bipolar transistors in the circuit of FIG. 12 by MOSFETs.

FIG. 17 shows a current reference circuit according to an eighth embodiment. Since this circuit is equivalent to one obtained by replacing the bipolar transistors Q21 to Q26 by MOSFETs M21 to M26 in FIG. 12, respectively, the same effects or advantages can be obtained as those in the fifth embodiment of FIG. 12.

The inverse PTAT subcircuit 102 corresponds to the circuit according to the second embodiment of FIG. 5.

Figure 18:
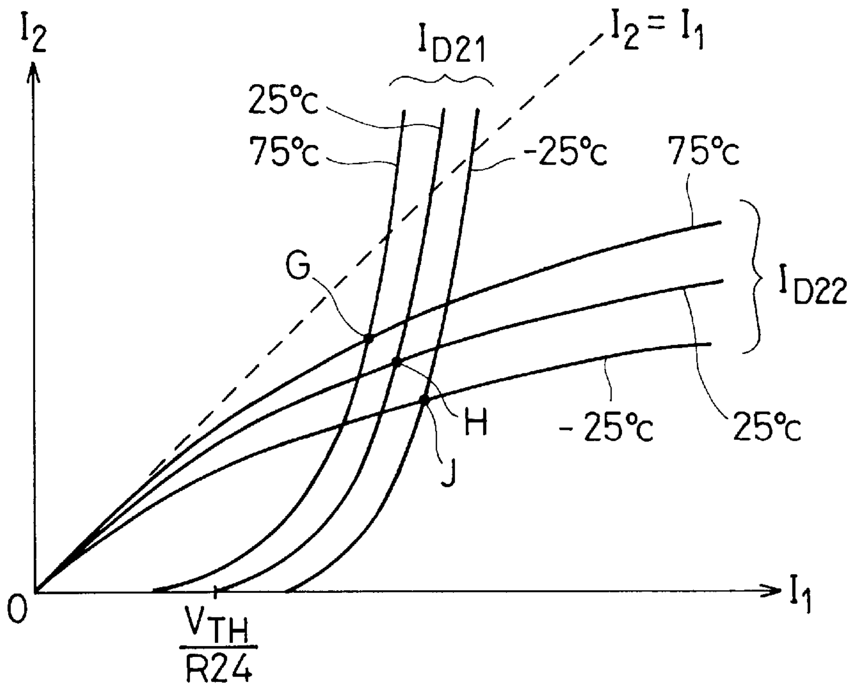
FIG. 18 is a graph showing the relationship between the reference and mirror currents $I_1$ and $I_2$ of the current reference circuit of FIG. 17.

FIG. 18 shows the relationship between the currents $I_1$ and $I_2$, in which $I_{D21}$ is a drain current of the MOSFET M21 and $I_{D22}$ is a drain current of the MOSFET M22. The operating point of the MOSFET M21 is set at the point G, H or J which are defined by the intersections of the $I_{D21}$ curves and $I_{D22}$ curves.

NINTH EMBODIMENT

Figure 19:
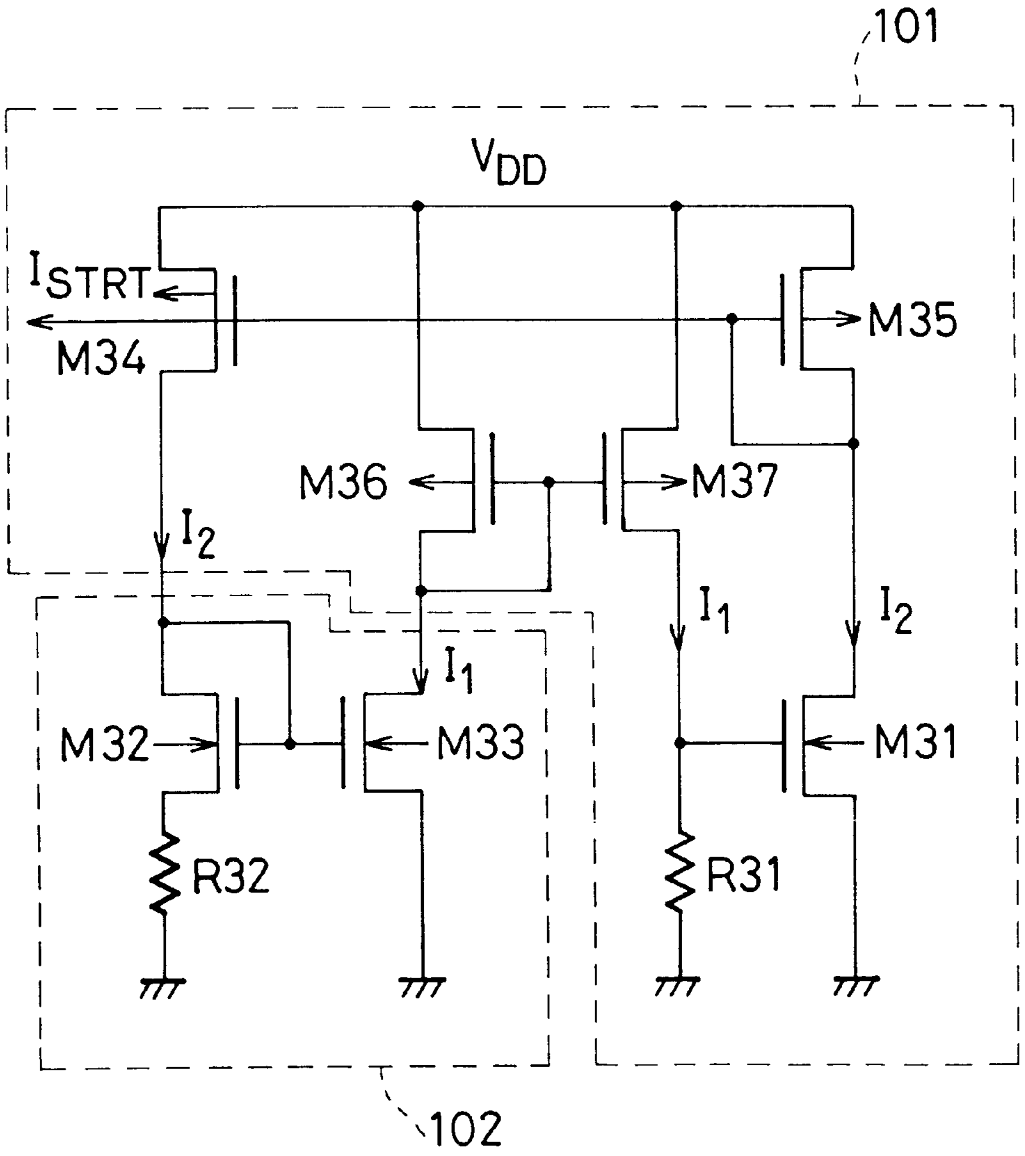
FIG. 19 is a circuit diagram of a current reference circuit composed of MOSFETs according to a ninth embodiment of the invention, which is equivalent to a circuit obtained by replacing the respective bipolar transistors in the circuit of FIG. 15 by MOSFETs.

FIG. 19 shows a current reference circuit according to a ninth embodiment. Since this circuit is equivalent to one obtained by replacing the bipolar transistors Q31 to Q37 by MOSFETs M31 to M37 in FIG. 14, respectively, the same effects or advantages can be obtained as those in the sixth embodiment of FIG. 14.

The inverse PTAT subcircuit 102 corresponds to the circuit according to the second embodiment of FIG. 5.

TENTH EMBODIMENT

Figure 20:
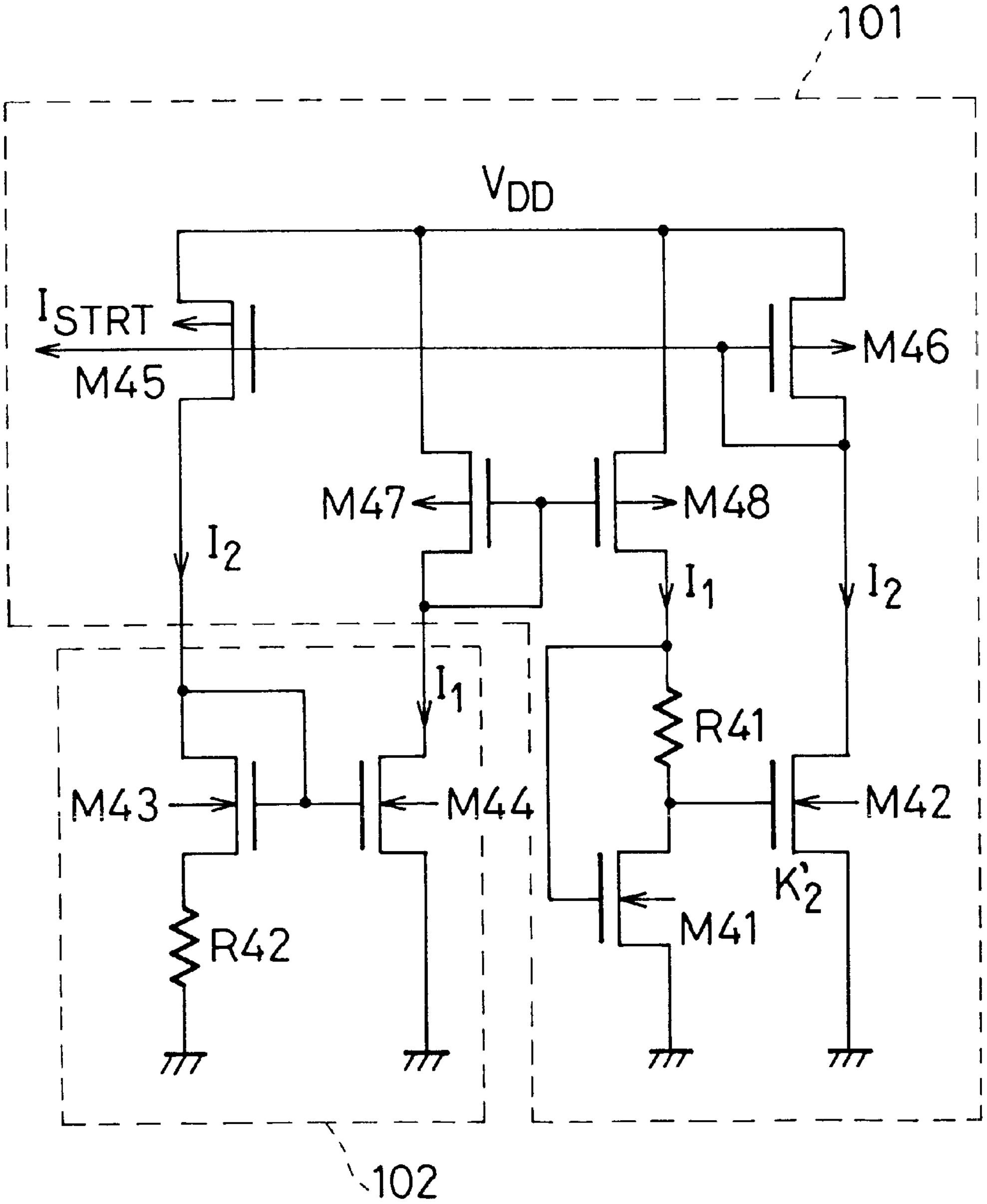
FIG. 20 is a circuit diagram of a current reference circuit composed of MOSFETs according to a tenth embodiment of the invention, which is equivalent to a circuit obtained by replacing the respective bipolar transistors in the circuit of FIG. 15 by MOSFETs.

FIG. 20 shows a current reference circuit according to a tenth embodiment. Since this circuit is equivalent to one obtained by replacing the bipolar transistors Q41 to Q48 by MOSFETs M41 to M48 in FIG. 15, respectively, the same effects or advantages can be obtained as those in the seventh embodiment of FIG. 15.

The inverse PTAT subcircuit 102 corresponds to the circuit according to the second embodiment of FIG. 5.

Figure 21:
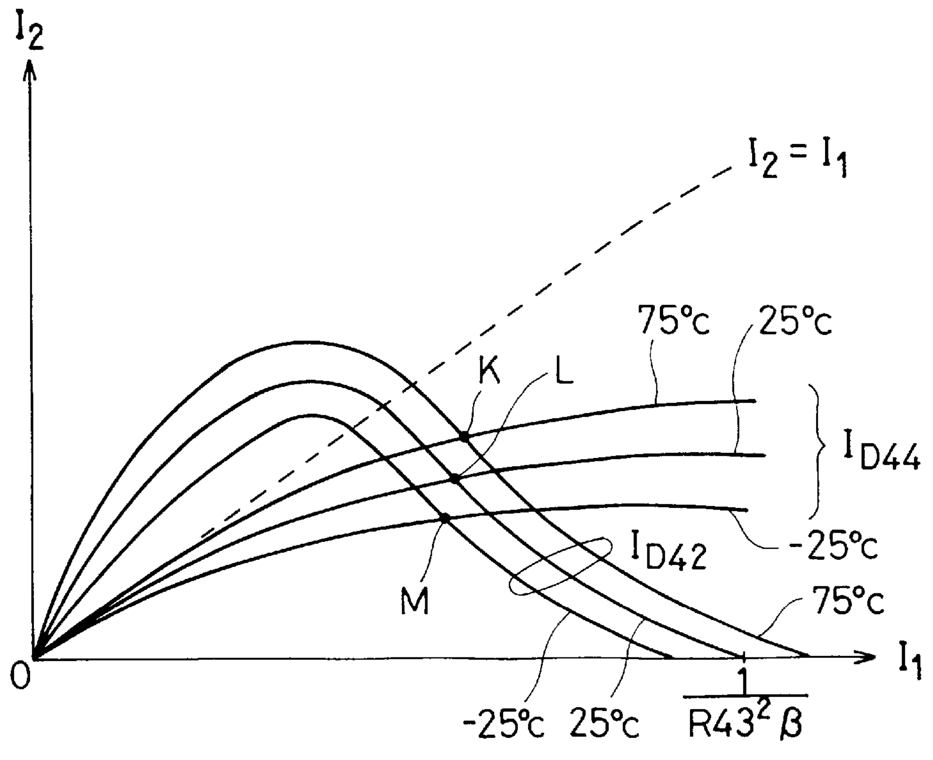
FIG. 21 is a graph showing the relationship between the reference and mirror currents $I_1$ and $I_2$ of the current reference circuit of FIG. 20.

FIG. 21 shows the relationship between the currents $I_1$ and $I_2$, in which $I_{D42}$ is a drain current of the MOSFET M42 and $I_{D44}$ is a drain current of the MOSFET M44. The operating point of the MOSFET M41 is set at the point K, L or M which are defined by the intersections of the $I_{D42}$ curves and $I_{D44}$ curves.

If the circuit current is low and/or the emitter area of each bipolar transistor is large, the current mirror circuit and current reference circuit according to the invention can be operated at an ultra low supply voltage of 1 V.

In the above embodiments, the polarity of each bipolar transistor and FETs can be changed to be opposite. For example, an npn bipolar transistor may be replaced by a pnp bipolar transistor, and an n-channel FET may be replaced by a p-channel FET.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A current reference circuit comprising:

an inverse PTAT subcircuit;

a PTAT subcircuit for driving said inverse PTAT subcircuit;

said inverse PTAT subcircuit and said PTAT subcircuit being mutually biased to each other;

said PTAT subcircuit producing first and second constant currents having positive temperature coefficients;

said inverse PTAT subcircuit being a current mirror circuit receiving said second constant current as a reference current and said first constant current as a mirror current for said reference current; and said first and second constant currents each flowing along a respective current path through said PTAT subcircuit and through said inverse PTAT subcircuit so as to cancel said positive temperature coefficients of said first and second constant currents.

2. The current reference circuit as claimed in claim 1, wherein said inverse PTAT subcircuit includes:

a first bipolar transistor having a base and a collector coupled together;

a second bipolar transistor having a base connected to the base of the first transistor; and a resistor connected to an emitter of the first transistor;

wherein said emitter of the first transistor is connected to an emitter of the second transistor through said resistor;

and wherein said reference current is supplied to the collector of the first transistor, and said mirror current for said reference current is produced at a collector of the second transistor.

3. The current reference circuit as claimed in claim 1, wherein said inverse PTAT subcircuit includes:

a first FET having a gate and a drain coupled together;

a second FET having a gate connected to the gate of said first FET; and a resistor connected to a source of said first FET;

wherein said source of said first FET is connected to a source of said second FET through said resistor;

and wherein said reference current is supplied to the drain of said first FET, and said mirror current for said reference current is produced at a drain of said second FET.

4. The current reference circuit as claimed in claim 1, wherein said inverse PTAT subcircuit includes:

a first bipolar transistor having a base and a collector connected through a first resistor to each other;

a second bipolar transistor having a base connected to the collector of the first transistor; and a second resistor connected to an emitter of said first transistor;

wherein said emitter of said first transistor is connected to an emitter of said second transistor through said second resistor;

and wherein said reference current is supplied to said collector of said first transistor, and said mirror current for said reference current is produced at a collector of said second transistor.

5. The current reference circuit as claimed in claim 1, wherein said inverse PTAT subcircuit includes:

a first FET having a gate and a drain connected through a first resistor to each other;

a second FET having a gate connected to the drain of said first FET; and a second resistor connected to a source of said first FET;

wherein said source of said first FET is connected to a source of said second FET through said second resistor, and said reference current is supplied to the drain of said first FET, and said mirror current for said reference current is produced at a drain of said second FET.

6. The current reference circuit as claimed in claim 2, wherein said PTAT subcircuit includes:

a Nagata current mirror circuit formed using a first pair of bipolar transistors;

a first simple current mirror circuit formed using a second pair of bipolar transistors; and a second simple current mirror circuit formed using a third pair of bipolar transistors;

wherein one transistor in each of said first, second, and third pairs of bipolar transistors is diode connected.

7. The current reference circuit as claimed in claim 3, wherein said PTAT subcircuit includes:

a Nagata current mirror circuit formed using a first pair of FETs;

a first simple current mirror circuit formed using a second pair of FETs; and a second simple current mirror circuit formed using a third pair of FETs;

wherein one FET in each of said first, second, and third pairs of FETs is diode connected.

* * * * *